United States Patent
Shibata

(10) Patent No.: US 7,443,734 B2
(45) Date of Patent: Oct. 28, 2008

(54) SEMICONDUCTOR MEMORY DEVICE WITH A VOLTAGE GENERATING CIRCUIT WHICH GENERATES A PLURALITY OF VOLTAGES USING A SMALL NUMBER OF ITEMS OF DATA

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/531,920

(22) Filed: Sep. 14, 2006

(65) Prior Publication Data

US 2007/0064495 A1    Mar. 22, 2007

(30) Foreign Application Priority Data

Sep. 22, 2005    (JP)    ............... 2005-275998

(51) Int. Cl.
  G11C 11/34    (2006.01)
(52) U.S. Cl. ............... 365/185.23; 365/185.18; 365/185.24; 365/185.28
(58) Field of Classification Search ............ 365/185.28, 365/185.03, 185.12, 185.22, 185.23, 185.17, 365/185.18, 185.24, 189.16, 189.2, 189.05, 365/210.11, 210.12, 230.06, 233.16
See application file for complete search history.

(56) References Cited

U.S. PATENT DOCUMENTS

| | | | | |
|---|---|---|---|---|
| 4,672,580 A | * | 6/1987 | Yau et al. ............... | 365/185.08 |
| 5,088,060 A | * | 2/1992 | Endoh et al. ............ | 365/185.17 |
| 5,295,106 A | * | 3/1994 | Jinbo ...................... | 365/218 |
| 5,361,227 A | * | 11/1994 | Tanaka et al. .......... | 365/185.22 |
| 5,546,351 A | * | 8/1996 | Tanaka et al. .......... | 365/230.06 |
| 5,671,388 A | * | 9/1997 | Hasbun .................... | 711/103 |
| 5,680,347 A | * | 10/1997 | Takeuchi et al. ....... | 365/185.17 |
| 5,696,717 A | * | 12/1997 | Koh ....................... | 365/185.22 |
| 5,721,698 A | * | 2/1998 | Lee et al. ................ | 365/104 |
| 5,726,882 A | * | 3/1998 | Miyamoto et al. ..... | 365/185.17 |
| 5,751,634 A | * | 5/1998 | Itoh ....................... | 365/185.17 |
| 5,768,191 A | * | 6/1998 | Choi et al. ............. | 365/185.22 |
| 5,805,500 A | * | 9/1998 | Campardo et al. ....... | 365/185.2 |
| 5,812,457 A | * | 9/1998 | Arase .................... | 365/185.22 |
| 6,108,238 A | * | 8/2000 | Nakamura et al. ..... | 365/185.22 |

(Continued)

FOREIGN PATENT DOCUMENTS

JP    2004-192789    7/2004

OTHER PUBLICATIONS

David Johns et al., Analog Integrated Circuit Design, Copyright 1997, John Wiley & Sons, Inc., pp. 483, 517.*

(Continued)

*Primary Examiner*—Huan Hoang
*Assistant Examiner*—Fernando N Hidalgo
(74) *Attorney, Agent, or Firm*—Oblon, Spivak, McClelland, Maier & Neustadt, P.C.

(57) ABSTRACT

In a memory cell array, a plurality of memory cells connected to word lines and bit lines are arranged in a matrix. A storage section stores an initial value of a write voltage corresponding to a first write operation and a correction value for correcting the write voltage. A voltage generating circuit generates a word line write voltage in a first write operation or a second write operation on the basis of the initial value and correction value of the write voltage stored in the storage section.

18 Claims, 17 Drawing Sheets

U.S. PATENT DOCUMENTS

| | | | | |
|---|---|---|---|---|
| 6,122,193 A * | 9/2000 | Shibata et al. | ......... | 365/185.03 |
| 6,178,115 B1 * | 1/2001 | Shibata et al. | ......... | 365/185.03 |
| 6,288,935 B1 * | 9/2001 | Shibata et al. | ......... | 365/185.03 |
| 6,331,945 B1 * | 12/2001 | Shibata et al. | ......... | 365/185.03 |
| 6,377,485 B1 * | 4/2002 | Shibata et al. | ......... | 365/185.03 |
| 6,496,412 B1 * | 12/2002 | Shibata et al. | ......... | 365/185.03 |
| 6,657,891 B1 | 12/2003 | Shibata et al. | | |
| 7,016,226 B2 | 3/2006 | Shibata et al. | | |
| 2001/0036104 A1 * | 11/2001 | Shibata et al. | ......... | 365/185.03 |
| 2002/0036930 A1 * | 3/2002 | Shibata et al. | ............... | 365/195 |
| 2003/0235080 A1 * | 12/2003 | Yaegashi et al. | ....... | 365/185.22 |

OTHER PUBLICATIONS

Rabaey et al., Digital Integrated Circuits, Copyright 1996, Prentice Hall, Second Edition, pp. 184, 253, 332, 598.*

* cited by examiner

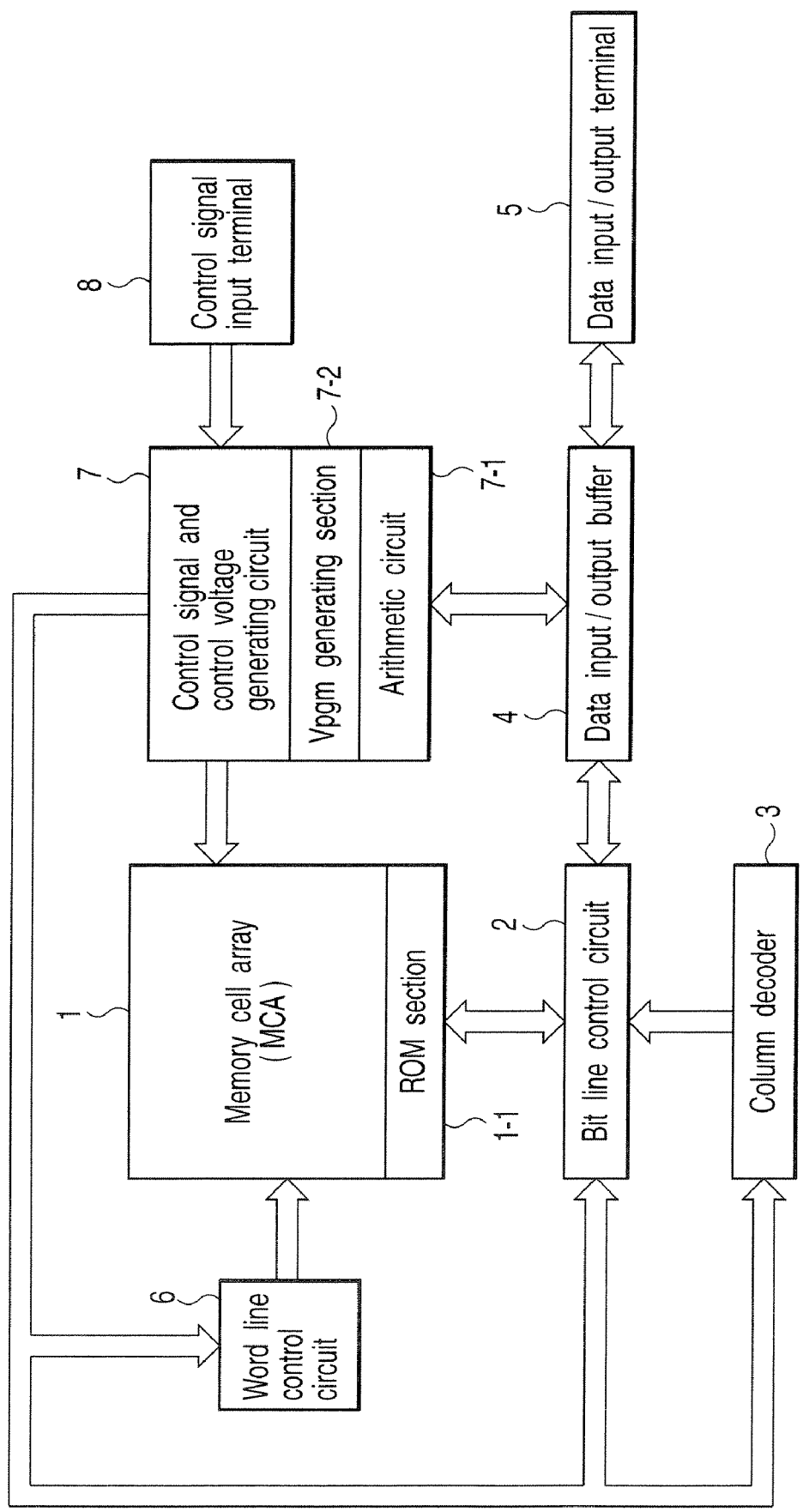
F I G. 1

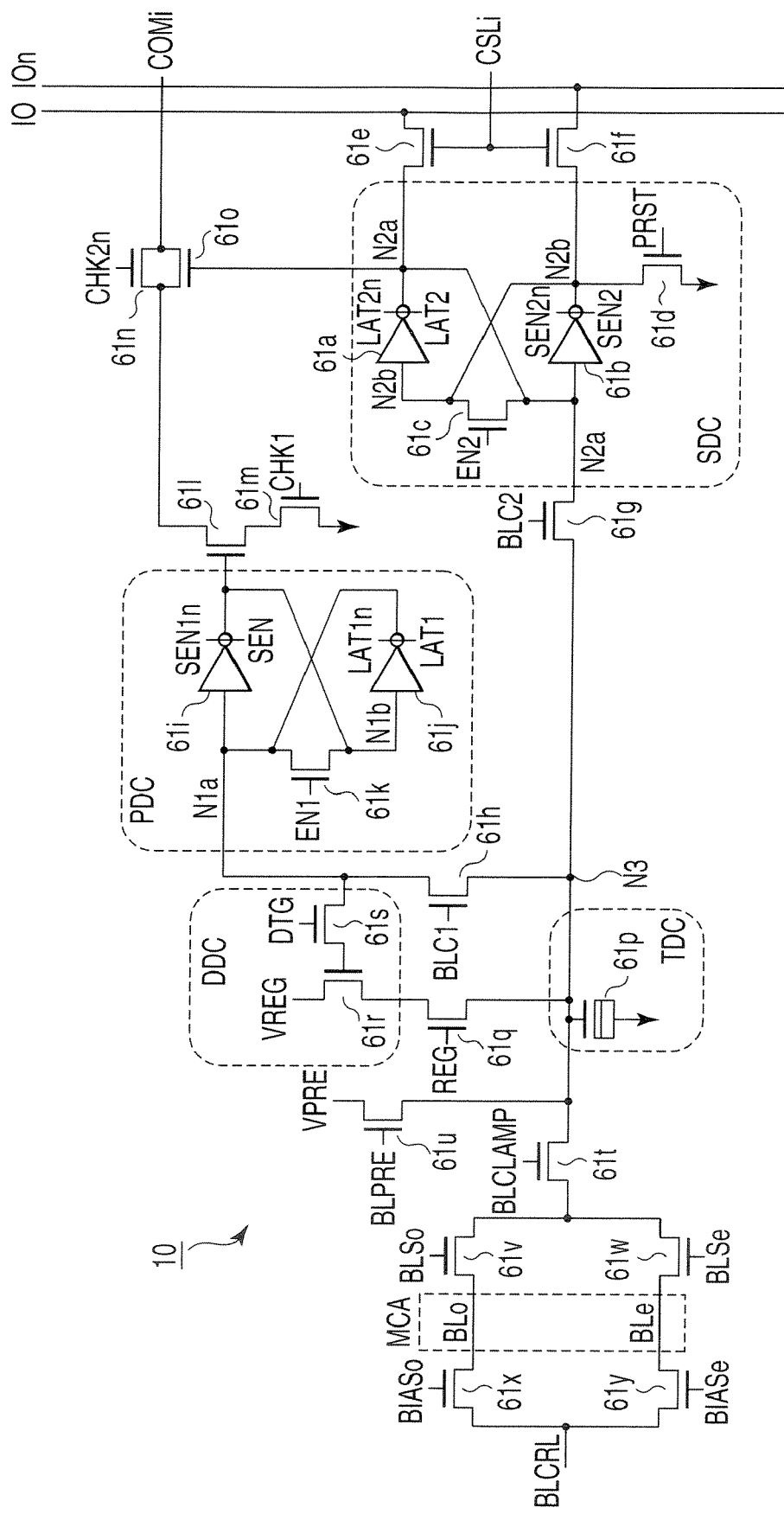
F I G. 4

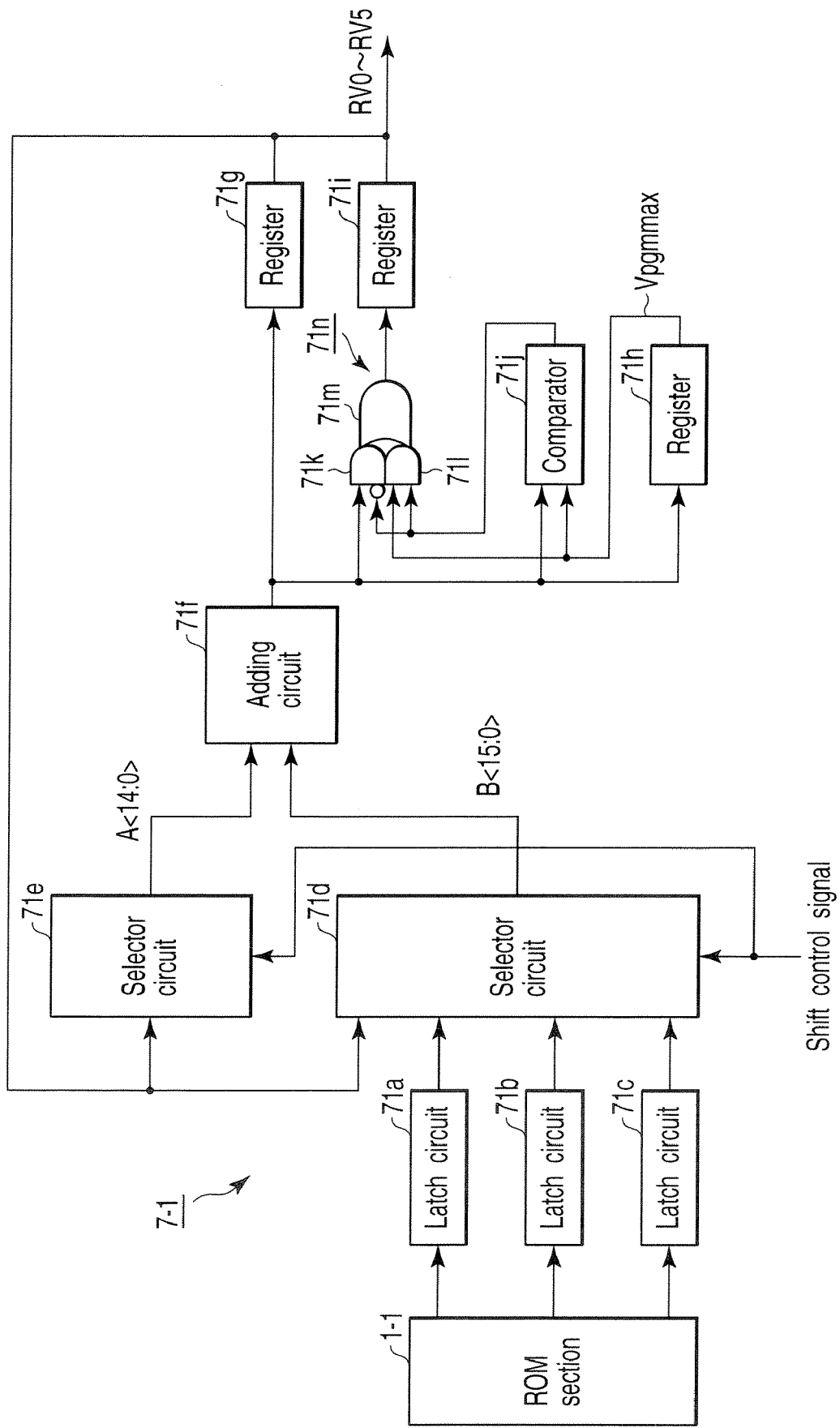
F I G. 5

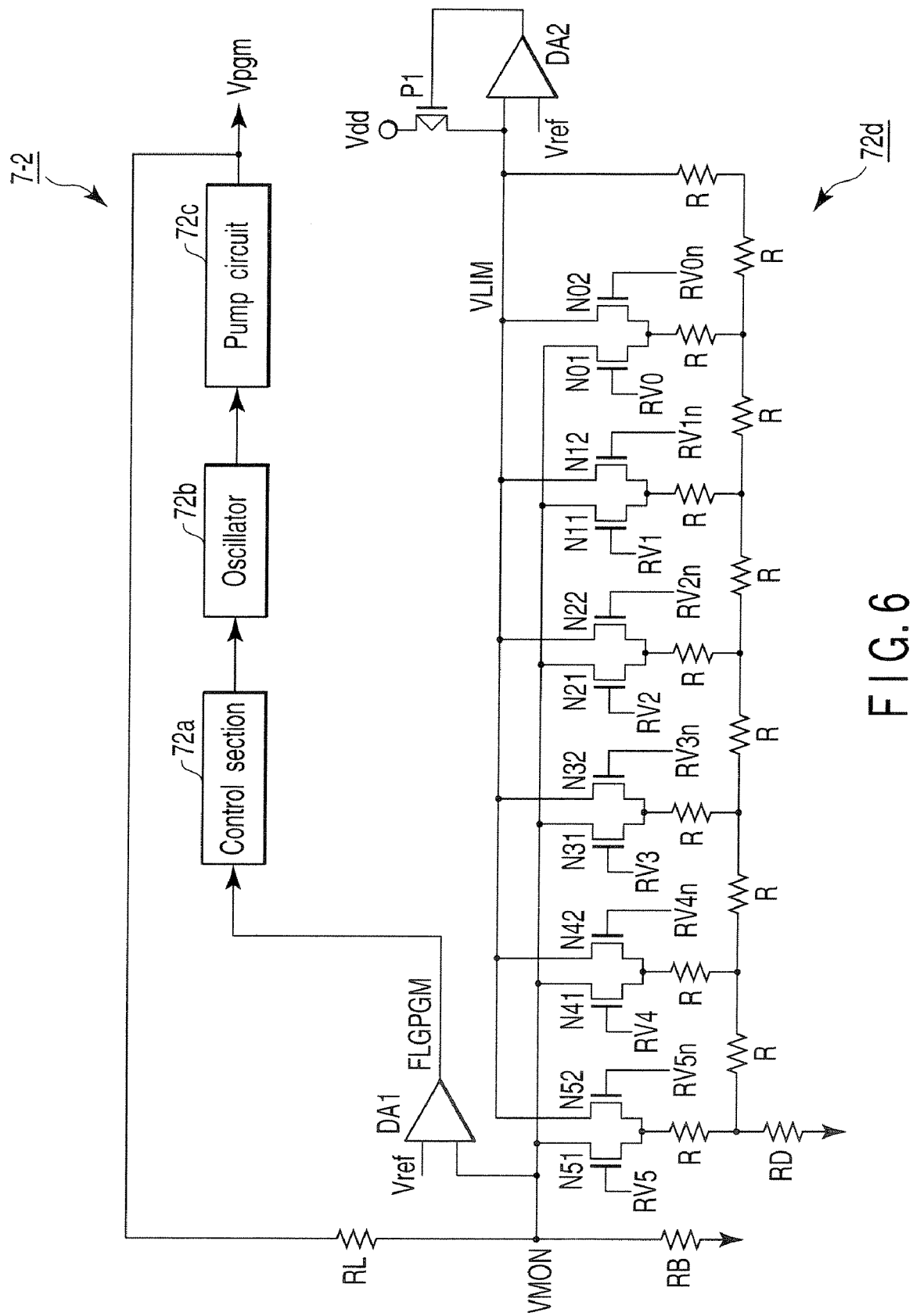
F I G. 6

FIG. 11A (SB)

FIG. 11B (RLSB)

FIG. 11C (REASB)

DVpgm = 0.20V

| D7 | D6 | D5 | D4 | D3 | D2 | D1 | D0 | | voltage |
|---|---|---|---|---|---|---|---|---|---|
|  |  | 0 | 0 | 0 | 0 | 0 | 0 | x | 12.00 |
|  |  | 0 | 0 | 0 | 0 | 0 | 1 |  | 12.20 |
|  |  | 0 | 0 | 0 | 0 | 1 | 0 |  | 12.40 |
|  |  | 0 | 0 | 0 | 0 | 1 | 1 |  | 12.60 |
|  |  | 0 | 0 | 0 | 1 | 0 | 0 |  | 12.80 |
|  |  | 0 | 0 | 0 | 1 | 0 | 1 |  | 13.00 |
|  |  | 0 | 0 | 0 | 1 | 1 | 0 |  | 13.20 |
|  |  | 0 | 0 | 0 | 1 | 1 | 1 |  | 13.40 |
|  |  | 0 | 0 | 1 | 0 | 0 | 0 |  | 13.60 |
|  |  | 0 | 0 | 1 | 0 | 0 | 1 |  | 13.80 |
|  |  | 0 | 0 | 1 | 0 | 1 | 0 |  | 14.00 |
|  |  | 0 | 0 | 1 | 0 | 1 | 1 |  | 14.20 |
|  |  | 0 | 0 | 1 | 1 | 0 | 0 |  | 14.40 |
|  |  | 0 | 0 | 1 | 1 | 0 | 1 |  | 14.60 |
|  |  | 0 | 0 | 1 | 1 | 1 | 0 |  | 14.80 |
|  |  | 0 | 0 | 1 | 1 | 1 | 1 |  | 15.00 |
|  |  | 0 | 1 | 0 | 0 | 0 | 0 |  | 15.20 |
|  |  | 0 | 1 | 0 | 0 | 0 | 1 |  | 15.40 |
|  |  | 0 | 1 | 0 | 0 | 1 | 0 |  | 15.60 |
|  |  | 0 | 1 | 0 | 0 | 1 | 1 |  | 15.80 |
|  |  | 0 | 1 | 0 | 1 | 0 | 0 |  | 16.00 |
|  |  | 0 | 1 | 0 | 1 | 0 | 1 |  | 16.20 |
|  |  | 0 | 1 | 0 | 1 | 1 | 0 |  | 16.40 |
|  |  | 0 | 1 | 0 | 1 | 1 | 1 |  | 16.60 |
|  |  | 0 | 1 | 1 | 0 | 0 | 0 |  | 16.80 |
|  |  | 0 | 1 | 1 | 0 | 0 | 1 |  | 17.00 |
|  |  | 0 | 1 | 1 | 0 | 1 | 0 |  | 17.20 |
|  |  | 0 | 1 | 1 | 0 | 1 | 1 |  | 17.40 |
|  |  | 0 | 1 | 1 | 1 | 0 | 0 |  | 17.60 |
|  |  | 0 | 1 | 1 | 1 | 0 | 1 |  | 17.80 |
|  |  | 0 | 1 | 1 | 1 | 1 | 0 |  | 18.00 |
|  |  | 0 | 1 | 1 | 1 | 1 | 1 |  | 18.20 |

FIG. 13

DVpgm = 0.25V

| D7 | D6 | D5 | D4 | D3 | D2 | D1 | D0 | | voltage |
|----|----|----|----|----|----|----|----|---|---------|
|    |    |    | 0  | 0  | 0  | 0  | 0  | x | 12.00   |
|    |    |    | 0  | 0  | 0  | 0  | 1  |   | 12.25   |
|    |    |    | 0  | 0  | 0  | 1  | 0  |   | 12.50   |
|    |    |    | 0  | 0  | 0  | 1  | 1  |   | 12.75   |
|    |    |    | 0  | 0  | 1  | 0  | 0  |   | 13.00   |
|    |    |    | 0  | 0  | 1  | 0  | 1  |   | 13.25   |
|    |    |    | 0  | 0  | 1  | 1  | 0  |   | 13.50   |
|    |    |    | 0  | 0  | 1  | 1  | 1  |   | 13.75   |
|    |    |    | 0  | 1  | 0  | 0  | 0  |   | 14.00   |
|    |    |    | 0  | 1  | 0  | 0  | 1  |   | 14.25   |
|    |    |    | 0  | 1  | 0  | 1  | 0  |   | 14.50   |
|    |    |    | 0  | 1  | 0  | 1  | 1  |   | 14.75   |
|    |    |    | 0  | 1  | 1  | 0  | 0  |   | 15.00   |
|    |    |    | 0  | 1  | 1  | 0  | 1  |   | 15.25   |
|    |    |    | 0  | 1  | 1  | 1  | 0  |   | 15.50   |
|    |    |    | 0  | 1  | 1  | 1  | 1  |   | 15.75   |
|    |    | 1  | 0  | 0  | 0  | 0  | 0  |   | 16.00   |
|    |    | 1  | 0  | 0  | 0  | 0  | 1  |   | 16.25   |
|    |    | 1  | 0  | 0  | 0  | 1  | 0  |   | 16.50   |
|    |    | 1  | 0  | 0  | 0  | 1  | 1  |   | 16.75   |
|    |    | 1  | 0  | 0  | 1  | 0  | 0  |   | 17.00   |
|    |    | 1  | 0  | 0  | 1  | 0  | 1  |   | 17.25   |
|    |    | 1  | 0  | 0  | 1  | 1  | 0  |   | 17.50   |
|    |    | 1  | 0  | 0  | 1  | 1  | 1  |   | 17.75   |
|    |    | 1  | 0  | 1  | 0  | 0  | 0  |   | 18.00   |
|    |    | 1  | 0  | 1  | 0  | 0  | 1  |   | 18.25   |
|    |    | 1  | 0  | 1  | 0  | 1  | 0  |   | 18.50   |
|    |    | 1  | 0  | 1  | 0  | 1  | 1  |   | 18.75   |
|    |    | 1  | 0  | 1  | 1  | 0  | 0  |   | 19.00   |
|    |    | 1  | 0  | 1  | 1  | 0  | 1  |   | 19.25   |
|    |    | 1  | 0  | 1  | 1  | 1  | 0  |   | 19.50   |
|    |    | 1  | 0  | 1  | 1  | 1  | 1  |   | 19.75   |

FIG. 14

DVpgm = 0.30V

| D7 | D6 | D5 | D4 | D3 | D2 | D1 | D0 | | voltage |
|---|---|---|---|---|---|---|---|---|---|
|  |  | 0 | 0 | 0 | 0 | 0 | 0 | x | 12.00 |
|  |  | 0 | 0 | 0 | 0 | 0 | 1 |  | 12.30 |
|  |  | 0 | 0 | 0 | 0 | 1 | 0 |  | 12.60 |
|  |  | 0 | 0 | 0 | 0 | 1 | 1 |  | 12.90 |
|  |  | 0 | 0 | 0 | 1 | 0 | 0 |  | 13.20 |
|  |  | 0 | 0 | 0 | 1 | 0 | 1 |  | 13.50 |
|  |  | 0 | 0 | 0 | 1 | 1 | 0 |  | 13.80 |
|  |  | 0 | 0 | 0 | 1 | 1 | 1 |  | 14.10 |
|  |  | 0 | 0 | 1 | 0 | 0 | 0 |  | 14.40 |
|  |  | 0 | 0 | 1 | 0 | 0 | 1 |  | 14.70 |
|  |  | 0 | 0 | 1 | 0 | 1 | 0 |  | 15.00 |
|  |  | 0 | 0 | 1 | 0 | 1 | 1 |  | 15.30 |
|  |  | 0 | 0 | 1 | 1 | 0 | 0 |  | 15.60 |
|  |  | 0 | 0 | 1 | 1 | 0 | 1 |  | 15.90 |
|  |  | 0 | 0 | 1 | 1 | 1 | 0 |  | 16.20 |
|  |  | 0 | 0 | 1 | 1 | 1 | 1 |  | 16.50 |
|  |  | 0 | 1 | 0 | 0 | 0 | 0 |  | 16.80 |
|  |  | 0 | 1 | 0 | 0 | 0 | 1 |  | 17.10 |
|  |  | 0 | 1 | 0 | 0 | 1 | 0 |  | 17.40 |
|  |  | 0 | 1 | 0 | 0 | 1 | 1 |  | 17.70 |
|  |  | 0 | 1 | 0 | 1 | 0 | 0 |  | 18.00 |
|  |  | 0 | 1 | 0 | 1 | 0 | 1 |  | 18.30 |
|  |  | 0 | 1 | 0 | 1 | 1 | 0 |  | 18.60 |
|  |  | 0 | 1 | 0 | 1 | 1 | 1 |  | 18.90 |
|  |  | 0 | 1 | 1 | 0 | 0 | 0 |  | 19.20 |
|  |  | 0 | 1 | 1 | 0 | 0 | 1 |  | 19.50 |
|  |  | 0 | 1 | 1 | 0 | 1 | 0 |  | 19.80 |
|  |  | 0 | 1 | 1 | 0 | 1 | 1 |  | 20.10 |
|  |  | 0 | 1 | 1 | 1 | 0 | 0 |  | 20.40 |
|  |  | 0 | 1 | 1 | 1 | 0 | 1 |  | 20.70 |
|  |  | 0 | 1 | 1 | 1 | 1 | 0 |  | 21.00 |
|  |  | 0 | 1 | 1 | 1 | 1 | 1 |  | 21.30 |

FIG. 15

DVpgm=0.50V

| D8 | D7 | D6 | D5 | D4 | D3 | D2 | D1 | D0 | voltage |
|---|---|---|---|---|---|---|---|---|---|
| 0 | 0 | 1 | 0 | 0 | 1 | 0 | 1 | 0 | 15.700 |
| 0 | 0 | 1 | 0 | 0 | 1 | 0 | 1 | 1 | 15.750 |
| 0 | 0 | 1 | 0 | 0 | 1 | 1 | 0 | 0 | 15.800 |
| 0 | 0 | 1 | 0 | 0 | 1 | 1 | 0 | 1 | 15.850 |
| 0 | 0 | 1 | 0 | 0 | 1 | 1 | 1 | 0 | 15.900 |
| 0 | 0 | 1 | 0 | 0 | 1 | 1 | 1 | 1 | 15.950 |
| 0 | 0 | 1 | 0 | 1 | 0 | 0 | 0 | 0 | 16.000 |
| 0 | 0 | 1 | 0 | 1 | 0 | 0 | 0 | 1 | 16.050 |
| 0 | 0 | 1 | 0 | 1 | 0 | 0 | 1 | 0 | 16.100 |
| 0 | 0 | 1 | 0 | 1 | 0 | 0 | 1 | 1 | 16.150 |
| 0 | 0 | 1 | 0 | 1 | 0 | 1 | 0 | 0 | 16.200 |
| 0 | 0 | 1 | 0 | 1 | 0 | 1 | 0 | 1 | 16.250 |
| 0 | 0 | 1 | 0 | 1 | 0 | 1 | 1 | 0 | 16.300 |
| 0 | 0 | 1 | 0 | 1 | 0 | 1 | 1 | 1 | 16.350 |
| 0 | 0 | 1 | 0 | 1 | 1 | 0 | 0 | 0 | 16.400 |
| 0 | 0 | 1 | 0 | 1 | 1 | 0 | 0 | 1 | 16.450 |
| 0 | 0 | 1 | 0 | 1 | 1 | 0 | 1 | 0 | 16.500 |
| 0 | 0 | 1 | 0 | 1 | 1 | 0 | 1 | 1 | 16.550 |
| 0 | 0 | 1 | 0 | 1 | 1 | 1 | 0 | 0 | 16.600 |
| 0 | 0 | 1 | 0 | 1 | 1 | 1 | 0 | 1 | 16.650 |
| 0 | 0 | 1 | 0 | 1 | 1 | 1 | 1 | 0 | 16.700 |
| 0 | 0 | 1 | 0 | 1 | 1 | 1 | 1 | 1 | 16.750 |
| 0 | 0 | 1 | 1 | 0 | 0 | 0 | 0 | 0 | 16.800 |
| 0 | 0 | 1 | 1 | 0 | 0 | 0 | 0 | 1 | 16.850 |
| 0 | 0 | 1 | 1 | 0 | 0 | 0 | 1 | 0 | 16.900 |
| 0 | 0 | 1 | 1 | 0 | 0 | 0 | 1 | 1 | 16.950 |
| 0 | 0 | 1 | 1 | 0 | 0 | 1 | 0 | 0 | 17.000 |
| 0 | 0 | 1 | 1 | 0 | 0 | 1 | 0 | 1 | 17.050 |
| 0 | 0 | 1 | 1 | 0 | 0 | 1 | 1 | 0 | 17.100 |
| 0 | 0 | 1 | 1 | 0 | 0 | 1 | 1 | 1 | 17.150 |
| 0 | 0 | 1 | 1 | 0 | 1 | 0 | 0 | 0 | 17.200 |
| 0 | 0 | 1 | 1 | 1 | 0 | 0 | 0 | 0 | 17.600 |
| 0 | 0 | 1 | 1 | 1 | 0 | 0 | 0 | 1 | 17.650 |
| 0 | 0 | 1 | 1 | 1 | 0 | 0 | 1 | 0 | 17.700 |
| 0 | 0 | 1 | 1 | 1 | 0 | 0 | 1 | 1 | 17.750 |
| 0 | 0 | 1 | 1 | 1 | 0 | 1 | 0 | 0 | 17.800 |
| 0 | 0 | 1 | 1 | 1 | 0 | 1 | 0 | 1 | 17.850 |
| 0 | 0 | 1 | 1 | 1 | 0 | 1 | 1 | 0 | 17.900 |

FIG. 16

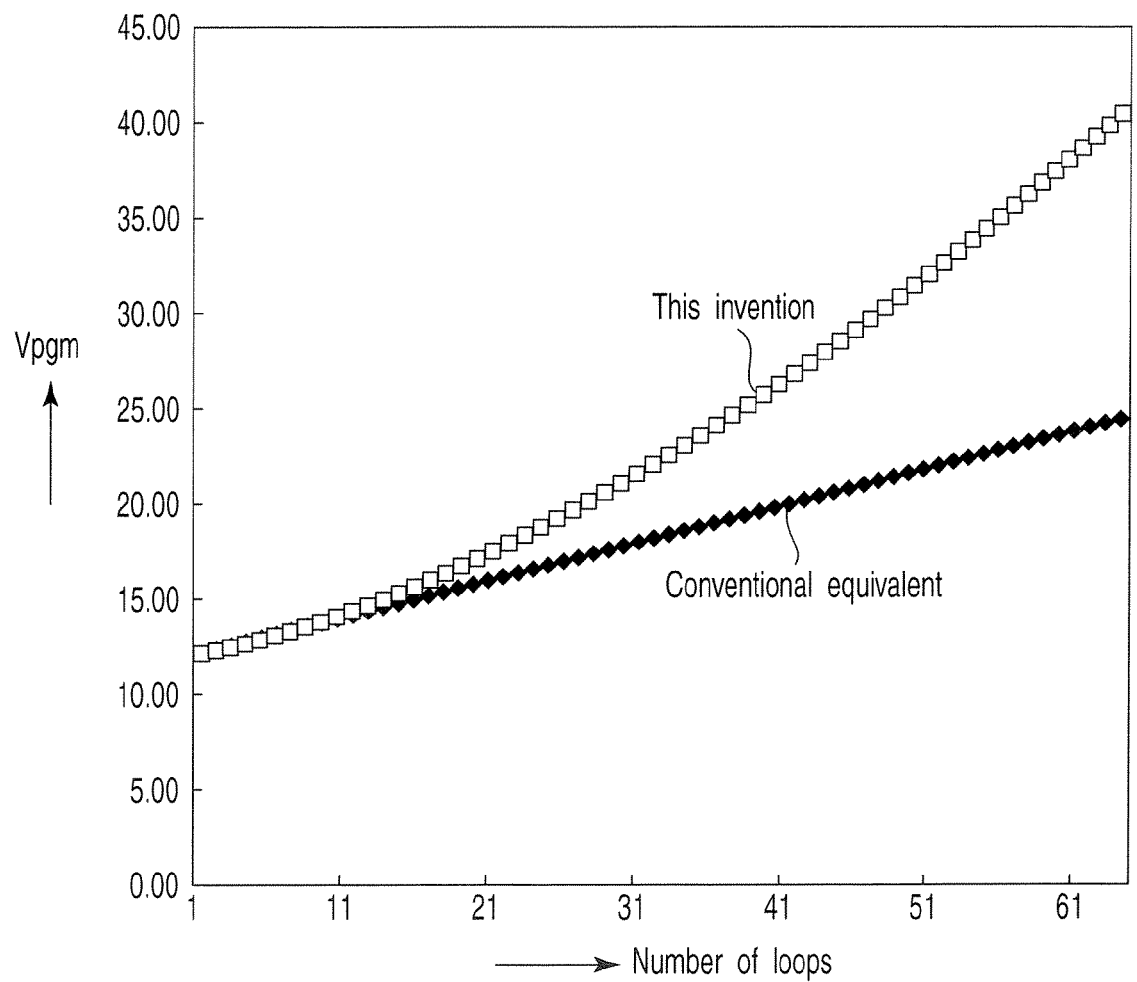
F I G. 17

SEMICONDUCTOR MEMORY DEVICE WITH A VOLTAGE GENERATING CIRCUIT WHICH GENERATES A PLURALITY OF VOLTAGES USING A SMALL NUMBER OF ITEMS OF DATA

CROSS-REFERENCE TO RELATED APPLICATION

This application is based upon and claims the benefit of priority from prior Japanese Patent Application No. 2005-275998, filed Sep. 22, 2005, the entire contents of which are incorporated herein by reference.

BACKGROUND OF THE INVENTION

1. Field of the Invention

This invention relates to a NAND flash memory using, for example, an EEPROM, and more particularly to a multi-level semiconductor memory device capable of storing multivalued data in a single memory.

2. Description of the Related Art

In a NAND flash memory, a plurality of memory cells arranged in the column direction are connected in series, thereby configuring a NAND cell. Each NAND cell is connected via a select gate to the corresponding bit line. Each bit line is connected to a latch circuit which latches write or read data. All or half of the cells arranged in the row direction are selected simultaneously. All or half of the cells simultaneously selected are written to or read from in unison (for example, Jpn. Pat. Appln. KOKAI Publication No. 2004-192789).

With the recent trend toward larger memory capacity, a multivalue memory which stores 2 or more bits in a cell has been developed. For example, to store 2 bits in a cell, it is necessary to set four threshold distributions. To store 3 bits, it is necessary to set eight threshold voltages. These threshold voltages have to be set in a range that does not exceed the read voltage. Therefore, in writing data, a write voltage is supplied to the control gate of the memory cell to change the threshold voltage, thereby verifying whether the threshold voltage has reached the threshold voltage corresponding to specific data. If the threshold voltage has not reached the specific threshold voltage, the write voltage supplied to the word line is increased a little and then the write operation is repeated. In this way, the threshold voltage of the memory cell is set. As described above, in the multivalue memory, the write operation and verify operation have to be repeated.

A write voltage is generated using a pump circuit and a limiter circuit. The limiter circuit generates a specific voltage by changing the resistance ratio according to the input signal. On the basis of the specific voltage, the pump circuit is controlled, thereby generating a specific voltage. The pump circuit is designed to be capable of setting a plurality of minimum generated voltages according to the input data.

However, in the multivalue memory, it is necessary to change the initial value of the write voltage according to the writing page or according to the cell already written to and its adjacent cells. Moreover, the increase (or the step width) of the write voltage in rewriting has to be changed according to the initial value of the write voltage. Therefore, it is necessary to generate many write voltages. The write voltage is set according to the data supplied to the limiter circuit. Many items of data have to be stored according to many write voltages. These items of data are trimmed and set in testing a semiconductor memory device. It requires a long time to trim many items of data. Accordingly, a semiconductor memory device has been desired which can easily generate a plurality of voltages with a reduced number of items of data to be stored.

BRIEF SUMMARY OF THE INVENTION

According to a first aspect of the present invention, there is provided a semiconductor memory device comprising: a memory cell array in which a plurality of memory cells connected to word lines and bit lines are arranged in a matrix; a storage section which stores an initial value of a write voltage corresponding to a write operation and a correction value for correcting the write voltage; and a voltage generating circuit which generates a word line write voltage in a first write operation on a first memory cell in the memory cell array or a second write operation on a second memory cell in the memory cell array on the basis of the initial value and correction value of the write voltage stored in the storage section.

According to a second aspect of the present invention, there is provided a semiconductor memory device comprising: a memory cell array in which a plurality of memory cells connected to word lines and bit lines are arranged in a matrix; and a voltage generating circuit which generates a word line write voltage on the basis of a reference voltage in a write operation and which includes an adjusting circuit that adjusts the reference voltage and that increases the reference voltage as the write voltage increases.

According to a third aspect of the present invention, there is provided a semiconductor memory device comprising: a memory cell array in which a plurality of memory cells connected to word lines and bit lines are arranged in a matrix; a control circuit which controls the potentials of the word lines and bit lines; and a voltage generating circuit which generates a write voltage, wherein the control circuit performs a first write operation on the basis of a first write voltage supplied from the voltage generating circuit, performs a second write operation on the basis of a voltage a first step voltage higher than the first write voltage supplied from the voltage generating circuit, performs an n-th write operation on the basis of a voltage an (n−1)-th step voltage higher than the (n−1)-th write voltage supplied from the voltage generating circuit, and performs an (n+1)-th write operation on the basis of a voltage an n-th step voltage higher than the n-th write voltage supplied from the voltage generating circuit, the n-th step voltage satisfying the expression the (n−1)-th step voltage$\leq$the n-th step voltage.

BRIEF DESCRIPTION OF THE SEVERAL VIEWS OF THE DRAWING

FIG. 1 is a block diagram of a semiconductor memory device according to a first embodiment of the present invention;

FIG. 4 is a circuit diagram of an example of the data storage circuit shown in FIG. 2;

FIG. 5 is a block diagram of an example of the arithmetic circuit shown in FIG. 1;

FIG. 6 is a circuit diagram showing an example of a Vpgm generating section included in the control signal and control voltage generating circuit of FIG. 1;

FIG. 13 is a table to explain an example of converting Vpgm into data in steps of 20 mV;

FIG. 14 is a table to explain an example of converting Vpgm into data in steps of 25 mV;

FIG. 15 is a table to explain an example of converting Vpgm into data in steps of 30 mV;

FIG. 16 is a table to explain an example of converting Vpgm into data in steps of 50 mV;

FIG. 17 is a diagram to explain the principle of a second embodiment of the present invention.

DETAILED DESCRIPTION OF THE INVENTION

Figure 2:
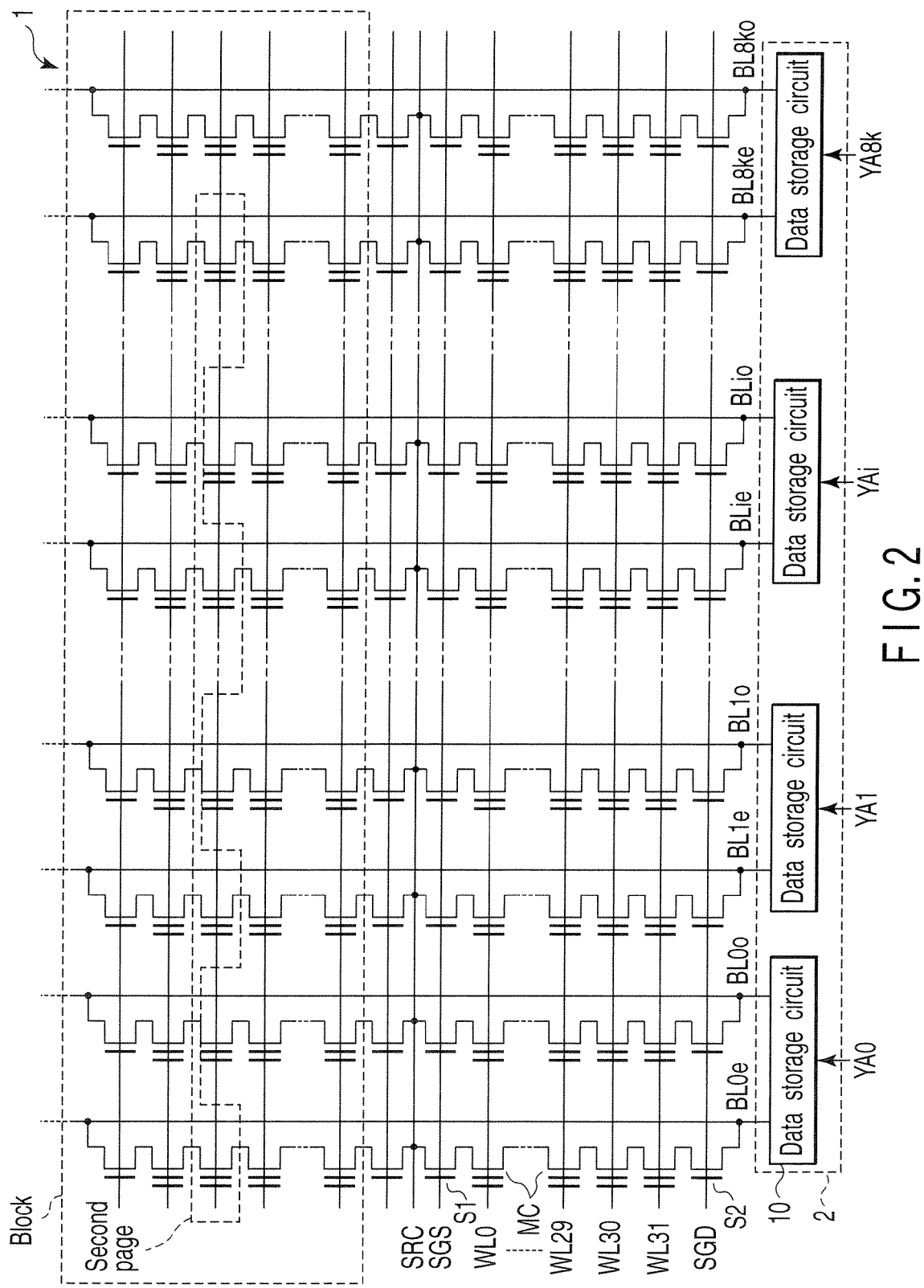
FIG. 2 is a circuit diagram showing the configuration of the memory cell array 1 and bit-line control circuit 2 shown in FIG. 1.

First, an embodiment of the present invention will be schematically explained.

In a multivalue memory, to speed up a write operation, it is necessary to pay attention to the following points:

(1) For a first page and a second page, and a first page and second page of each of the adjacent cells, the initial value of a write voltage Vpgm supplied to a word line in writing and an increase in the write voltage (or step voltage DVpgm) are optimized.

(2) The boost method on the source side of the word line is caused to differ from that on the drain side of the word line.

(3) A correction value is set for Vpgm word line by word line.

However, if data whose write voltage Vpgm and step voltage DVpgm are both optimized is stored as shown in item (1), the number of items of data will increase. If the step voltage differs as in item (1), the minimum voltage of the write voltage Vpgm differs when the boost method in item (2) is changed. Thus, a correction value, for example, the difference voltage caused by the difference of the boost method, such as the difference voltage erase self boost-self boost (EASE-SB) between erase self boost (EASB) and self boost (SB), differs from one word line to another. Accordingly, all the data is required for each step voltage DVpgm.

On the other hand, the limiter circuit controls the output voltage of the pump circuit, thereby generating a write voltage Vpgm. The minimum step voltage of the limiter circuit can be set to, for example, 0.3, 0.250, and 0.200V according to the first page and second page and the first page and second page of each of the adjacent cells. However, when many minimum step voltages are provided as described above, it is necessary to provide a correction value, such as a voltage difference caused by the difference of the boost method, for each minimum step. If the minimum step voltage of the limiter circuit is 50 mV, the least common multiple of 0.3, 0.25, and 0.2V, a problem will arise: the step width of the limiter circuit will be nonuniform. Accordingly, the minimum step of the limiter circuit has to be made 0.3, 0.25, or 0.2V, as high a step voltage as possible.

In the embodiment, suppose the write voltage Vpgm does not have an initial value for each minimum step voltage and the initial value of the write voltage Vpgm is the one set by trimming. At the beginning of writing, the initial Vpgm trimmed is converted temporarily in steps of 50 mV (0.4V=0.05×8, 0.5V=0.05×10, 0.9V=0.05×18, 1.2V=0.05×24), the greatest common measure of the minimum step voltages of the odd-numbered bit lines and even-numbered bit lines on the first page and second page. To this voltage, a parameter, such as the difference voltage between a voltage of the word line to be written into and the initial value of Vpgm, the correction value of each word line, or the difference between EASB and SB, is added. Thereafter, division is done, thereby returning to the minimum step voltage of the limiter circuit (0.3V=0.05V×6, 0.25V=0.05V×5, 0.2V=0.05V×4). By doing this, it is not necessary to prepare data for each of the minimum step voltages of the limiter circuit, which enables a plurality of voltages to be generated easily.

Hereinafter, referring to the accompanying drawings, embodiments of the present invention will be explained.

First Embodiment

FIG. 1 shows the configuration of a semiconductor memory device, such as a NAND flash memory capable of storing 4-value (2-bit) data, according to a first embodiment of the present invention.

A memory cell array 1 includes a plurality of bit lines and a plurality of word lines and a common source line. In the memory cell array 1, electrically data rewritable memory cells composed of, for example, EEPROM cells are arranged in a matrix.

The memory cell array 1 has a ROM section 1-1. The ROM section 1-1, which functions as fuses, stores data about various voltages obtained by, for example, trimming in a test before shipment.

Moreover, a bit line control circuit 2 for controlling bit lines and a word line control circuit 6 are connected to the memory cell array 1.

The bit line control circuit 2 reads data from a memory cell in the memory cell array 1 via a bit line, detects the state of a memory cell in the memory cell array 1 via a bit line, or writes data to a memory cell in the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 at a data input/output terminal 5 to the outside world.

The write data externally input to the data input/output terminal is input via the data input/output buffer 4 to the data storage circuit selected by the column decoder 3.

The word line control circuit 6 selects a word line in the memory cell array 1 and applies a voltage necessary for reading, writing, or erasing to the selected word line.

The memory cell array 1, bit line control circuit 2, column decoder 3, data input/output buffer 4, and word line control circuit 6 are connected to a control signal and control voltage generating circuit 7 and are controlled by the control signal and control voltage generating circuit 7. The control signal and control voltage generating circuit 7 is connected to a control signal input terminal 8 and is controlled by a control signal externally input via the control signal input terminal 8. The control signal and control voltage generating circuit 7 includes an arithmetic circuit 7-1 and a Vpgm generating section 7-2 described later. The arithmetic circuit 7-1 calculates necessary data to generate a write voltage in writing data. The Vpgm generating circuit 7-2 generates a write voltage Vpgm according to the data supplied from the arithmetic circuit 7-1.

The bit line control circuit 2, column decoder 3, word line control circuit 6, and control signal and control voltage generating circuit 7 constitute a write circuit and a read circuit.

FIG. 2 shows the configuration of the memory cell array 1 and bit line control circuit 2 shown in FIG. 1. In the memory cell array 1, a plurality of NAND cells are arranged. A NAND cell is composed of a memory cell MC made up of, for example, 32 EEPROMs connected in series and select gates S1, S2. The select gate S2 is connected to bit line BL0e and the select gate S1 is connected to a source line SRC. The control gates of the memory cells MC arranged in each row are connected equally to word lines WL0 to WL29, WL30, WL31. The select gates S2 are connected equally to a select line SGD. The select gates S1 are connected equally to a select line SGS.

The bit line control circuit 2 has a plurality of data storage circuits 10. Bit line pairs (BL0e, BL0o), (BL1e, BL1o), ..., (BLie, BLio), (BL8ke, BL8ko) are connected to the individual data storage circuits 10 in a one-to-one correspondence.

As shown by a broken line, the memory cell array 1 includes a plurality of blocks. Each block is composed of a plurality of NAND cells. For example, data is erased in blocks. An erase operation is carried out simultaneously on two bit lines connected to the data storage circuit 10.

A plurality of memory cells (the memory cells enclosed by a broken line), which are arranged every other bit line and are connected to a word line, constitute a sector. Data is written or read in sectors.

In a read operation, a program verify operation, and a program operation, one of the two bit lines (BLie, BLio) connected to the data storage circuit 10 is selected according to an address signal (YA0, YA1, ..., YAi, ..., YA8k) externally supplied. Moreover, according to an external address, one word line is selected.

Figure 3A:
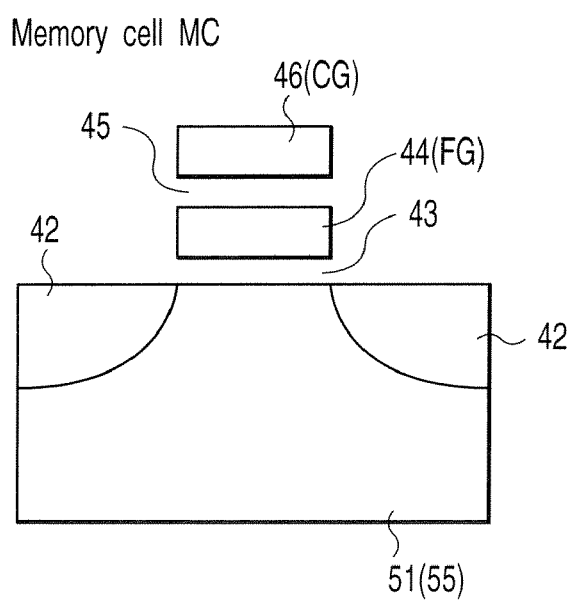
FIG. 3A is a sectional view of a memory cell and FIG. 3B is a sectional view of a select gate.
Figure 3B:
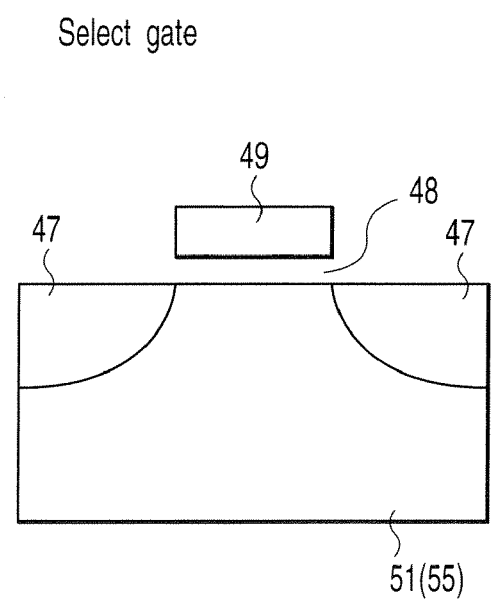

FIGS. 3A and 3B show a sectional view of a memory cell and that of a select transistor. FIG. 3A shows a memory cell. In a substrate 51 (or a p-well region 55 described later), an n-type diffused layer 42 is formed as the source and drain of a memory cell. Above the p-well region 55, a floating gate (FG) 44 is formed via a gate insulating film 43. Above the floating gate 44, a control gate (CG) 46 is formed via an insulating film 45. FIG. 3B shows a select gate. In the p-well region 55, an n-type diffused layer 47 is formed as a source and a drain. Above the p-well region 55, a control gate 49 is formed via a gate insulating film 48.

FIG. 4 is a circuit diagram of an example of the data storage circuit 10 shown in FIG. 2.

The data storage circuit 10 includes a primary data cache (PDC), a secondary data cache (SDC), a dynamic data cache (DDC), and a temporary data cache (TDC). The SDC, PDC, and DDC are used for the manipulation of internal data when the input data is held in a write operation, the read data is held in a read operation, the data is held temporarily in a verify operation, or multivalue data is stored. The TDC is used for the manipulation of internal data when, in a read operation, the data on a bit line is amplified and held temporarily and, at the same time, multivalue data is stored.

The SDC is composed of clocked inverter circuits 61a, 61b constituting a latch circuit and transistors 61c, 61d. The transistor 61c is connected between the input end of the clocked inverter circuit 61a and the input end of the clocked inverter circuit 61b. A signal EN2 is supplied to the gate of the transistor 61c. The transistor 61d is connected between the output end of the clocked inverter circuit 61b and the ground. A signal PRST is supplied to the gate of the transistor 61d. Node N2a of the SDC is connected to an input/output data line IO via a column select transistor 61e. Node N2b of the SDC is connected to an input/output data line IOn via a column select transistor 61f. A column select signal CSLi is supplied to the gates of the transistors 61e, 61f. Node N2a of the SDC is connected to node N1a of the PDC via transistors 61g, 61h. A signal BLC2 is supplied to the gate of the transistor 61g. A signal BLC1 is supplied to the gate of the transistor 61h.

The PDC is composed of clocked inverter circuits 61i, 61j and a transistor 61k. The transistor 61k is connected between the input end of the clocked inverter circuit 61i and the input end of the clocked inverter circuit 61j. A signal EN1 is supplied to the gate of the transistor 61k. Node N1b of the PDC is connected to the gate of the transistor 61l. One end of the current path of the transistor 61l is connected to the ground via a transistor 61m. A signal CHK1 is supplied to the gate of the transistor 61m. The other end of the current path of the transistor 61l is connected to one end of the current path of transistors 61n, 61o constituting a transfer gate. A signal CHK2n is supplied to the gate of the transistor 61n. The gate of the transistor 61o is connected to node N2a of the SDC. A signal COMi is supplied to the other end of the current path of the transistors 61n, 61o. The signal COMi is common to all of the data storage circuits 10. The signal COMi is a signal to indicate whether the verification of all the data storage circuits 10 has been completed. As described later, after the verification has been completed, node N1b of the PDC goes low. In this state, when the signals CHK1, CHK2n are made high, if the verification has been completed, signal COMi goes high.

Furthermore, the TDC is composed of, for example, a MOS capacitor 61p. The capacitor 61p is connected between junction node N3 of the transistors 61g, 61h and the ground. The DDC is connected to junction node N3 via a transistor 61q. A signal REG is supplied to the gate of the transistor 61q.

The DDC is composed of transistors 61r, 61s. A signal VREG is supplied to one end of the current path of the transistor 61r. The other end of the current path of the transistor 61r is connected to the current path of the transistor 61q. The gate of the transistor 61r is connected to node N1a of the PDC via the transistor 61s. A signal DTG is supplied to the gate of the transistor 61s.

In addition, one end of the current path of transistors 61t, 61u is connected to junction node N3. A signal VPRE is supplied to the other end of the current path of the transistor 61u. A signal BLPRE is supplied to the gate of the transistor 61u. A signal BLCLAMP is supplied to the gate of the transistor 61t. The other end of the current path of the transistor 61t is connected to one end of bit line BLo via a transistor 61v and to one end of bit line BLe via a transistor 61w. Signals BLSo, BLSe are supplied to the gates of the transistors 61v, 61w, respectively. The other end of bit line BLo is connected to one end of the current path of a transistor 61x. A signal BIASo is supplied to the gate of the transistor 61x. The other end of bit line BLe is connected to one end of the current path of a transistor 61y. A signal BIASe is supplied to the gate of the transistor 61y. A signal BLCRL is supplied to the other ends of the transistors 61x, 61y. The transistors 61x, 61y are turned on complementarily according to signals BIASo, BIASe, thereby supplying the potential of the signal BLCRL to the unselected bit lines.

The aforementioned signals and voltages are generated by the control signal and control voltage generating circuit 7 of FIG. 1. Under the control of the control signal and control voltage generating circuit 7, the operations below are controlled.

The NAND flash memory, which is, for example, a 4-valued memory, can store 2-bit data in a cell. Switching between 2 bits is done using an address (a first page, a second page).

FIG. 5 shows an example of the arithmetic circuit 7-1 of FIG. 1.

In FIG. 5, the arithmetic circuit 7-1 is composed of latch circuits 71a, 71b, 71c, selector circuits 71d, 71e, an adding circuit 71f, registers 71g, 71h, 71i, a comparator 71j, AND circuits 71k, 71l, and an OR circuit 71m.

The data read from the ROM section 1-1 is held in the latch circuits 71a, 71b, 71c. The output ends of the latch circuits 71a, 71b, 71c and the output end of the register 71g are connected to the input end of a selector circuit 71d. The selector circuit 71d has the function of not only selecting an input signal according to a control signal but also shifting the input data toward the LSB (Least Significant Bit) or MSB (Most Significant Bit) and outputting the resulting data. As a result, the input data is divided or multiplied, depending on the direction in which the data is shifted.

Moreover, a selector circuit 71e, which also has the same function as that of the selector circuit 71d, divides or multiplies the data supplied from the register 71g according to a control signal and outputs the resulting data. The output data of the selector circuits 71d, 71e are supplied to the adding circuit 71f, which adds them. The output data of the adding circuit 71f is held by the register 71g.

The register 71h holds the maximum value Vpgmmax of a write voltage Vpgm previously calculated using the selectors 71d, 71e and adding circuit 71f. The comparator 71j compares Vpgm output from the adding circuit 71f with the maximum value Vpgmmax held in the register 71h. The AND circuits 71k, 71l, and OR circuit 71m, which constitute a selector 71n, selects one of the output data of the adding circuit 71f and the output data in the register 71h according to the output signal of the comparator 71j. Specifically, if the comparator 71j has shown that the output data of the adding circuit 71f is smaller than the maximum value Vpgmmax, the selector 71n outputs the output data of the adding circuit 71f. If the comparator 71j has shown that the output data of the adding circuit 71f is larger than the maximum value Vpgmmax, the selector 71n outputs the maximum value Vpgmmax. The register 71i holds the output data in the selector 71n and outputs the data as control signals RV0 to RV5 for a limiter circuit described later. To prevent the output data from colliding with one another, the data output timing is switched between the registers 71g, 71i according to a control signal (not shown).

FIG. 6 shows a Vpgm generating section 7-2 included in the control signal and control voltage generating circuit 7 of FIG. 1. The Vpgm generating section 7-2 includes a control section 72a, an oscillator 72b, a pump circuit 72c, and a limiter circuit 72d. The control section 72a controls the oscillator 72b according to the output voltage of the limiter circuit 72d. The pump circuit 72c generates a write voltage Vpgm according to the clock signal supplied from the oscillator 72b. The write voltage Vpgm is supplied not only to the word line control circuit 6 but also to the limiter circuit 72d.

The limiter circuit 72d includes resistances RL, RB, a plurality of n-channel transistors N01, N02, N11, N12, N21, N22, N31, N32, N41, N42, N51, N52, a plurality of resistances R, a resistance RD, differential amplifiers DA1, DA2, and a p-channel transistor P1.

The resistances RL, RB connected in series divide a write voltage Vpgm. One end of the current path of the n-channel transistors N01, N11, N21, N31, N41, N51 is connected to the junction node of the resistances RL, RB. One end of the current path of the n-channel transistors N02, N12, N22, N32, N42, N52 is connected to one input terminal of the differential amplifier DA2. The plurality of resistances R are connected between the other ends of the current paths the transistors N01 to N51, N02 to N52 and one input terminal of the differential amplifier DA2 in such a manner that they are arranged in a ladder-like shape. The resistance RD is connected via the resistance R between the other ends of the current paths of the transistors N51, N52 and the ground.

The p-channel transistor P1 is connected between one input end of the differential amplifier DA2 and a terminal to which a power supply Vdd is supplied. The gate of the p-channel transistor P1 is connected to the output end of the differential amplifier DA2. A reference voltage Vref generated by a bandgap reference circuit (not shown) is supplied to the other input end of the differential amplifier DA2.

The reference voltage Vref is supplied to one input end of the differential amplifier DA1. The other input end of the differential amplifier DA1 is connected to the junction node of the resistances RL and RB. The output end of the differential amplifier DA1 is connected to the control section 72a.

The limiter circuit 72d controls a write voltage Vpgm according to the signal supplied from the arithmetic circuit 7-1. Specifically, signals RV0 to RV5 supplied from the arithmetic circuit 7-1 are supplied to the gates of the transistors N01 to N51. The inverted signals RV0n to RV5n of signals RV0 to RV5 are supplied to the gates of the transistors N02 to N52. The output voltage of the limiter circuit 72d is compared with the reference voltage Vref at the differential amplifier DA1. The output signal of the differential amplifier DA1 is supplied to the control section 72a.

The relationship between the write voltage Vpgm, the minimum value Vpgm_min of the write voltage Vpgm, and the step voltage DVpgm are represented by the following equation:

$$Vpgm = Vpgm\_min + DVpgm \times (32RV5 + 16RV4 + 8RV3 + 4RV2 + 2RV1 + RV0)$$

$$Vpgm\_min = Vref \times (1 + RL/RB)$$

$$DVpgm = Vref \times RL/(R+RD)/64$$

Accordingly, when 0.3, 0.25, and 0.2V are required for the minimum Vpgm, three resistances RD are prepared separately and are switched for use.

Figure 7A:
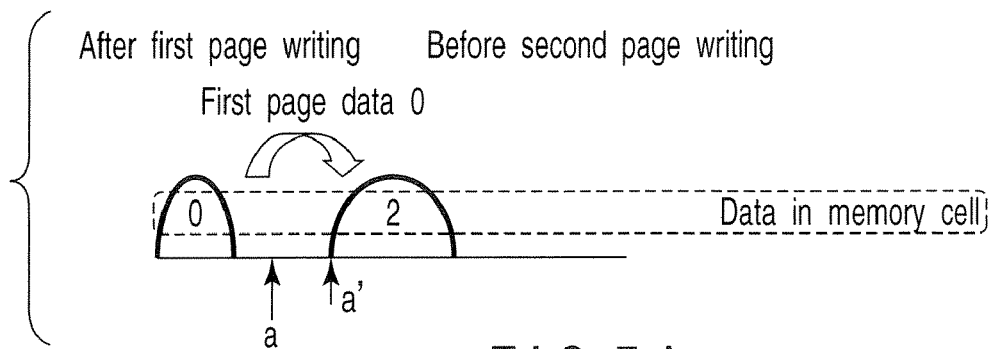
FIGS. 7A and 7B show the relationship between the data in a memory cell and the threshold voltages of the memory cell.
Figure 7B:
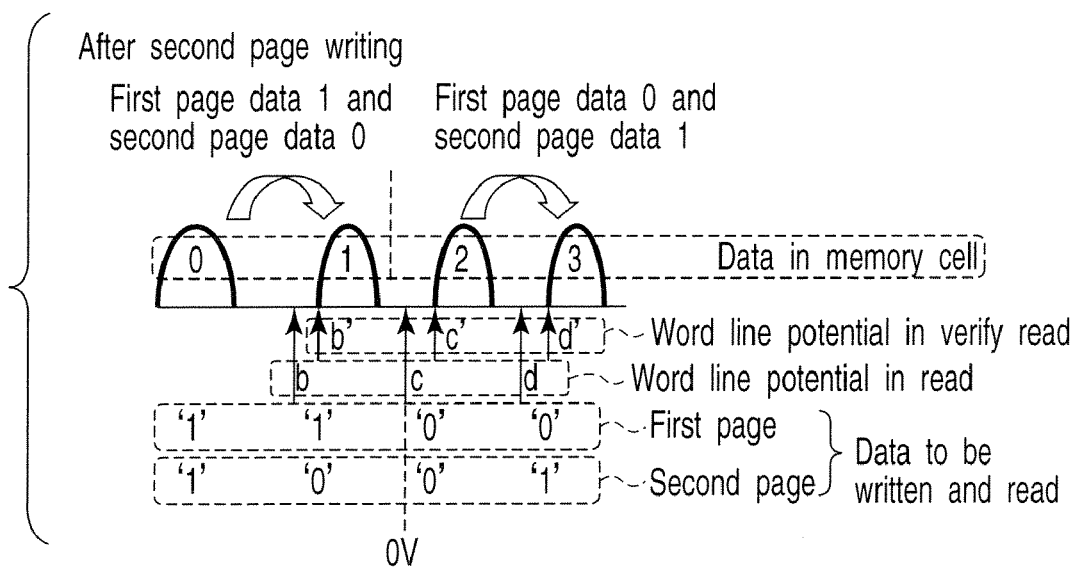

FIGS. 7A and 7B show the relationship between the data in a memory cell and the threshold voltage of the memory cell. As shown in FIG. 7A, when an erase operation has been carried out, the data in the memory cell becomes "0". When the first page is written into, the data in the memory cell becomes data "0" and data "2". That is, if the write data is "1", the data remains at data "0". If the write data is "0", the data becomes data "2". After the second page has been written to, the data in the memory cell becomes data "0", "1", "2", and "3". Specifically, if the first-page write data is "1" and the second-page write data "1", the data in the memory cell remains at data "0". If the first-page write data is "1" and the second-page write data "0", the data in the memory cell becomes "1". If the first-page write data is "0" and the second-page write data is "0", the data in the memory cell becomes "2". If the first-page write data is "0" and the second-page write data is "1", the data in the memory cell becomes "3". In the first embodiment, the data in the memory cell is defined in ascending order of threshold voltage.

Figure 8:
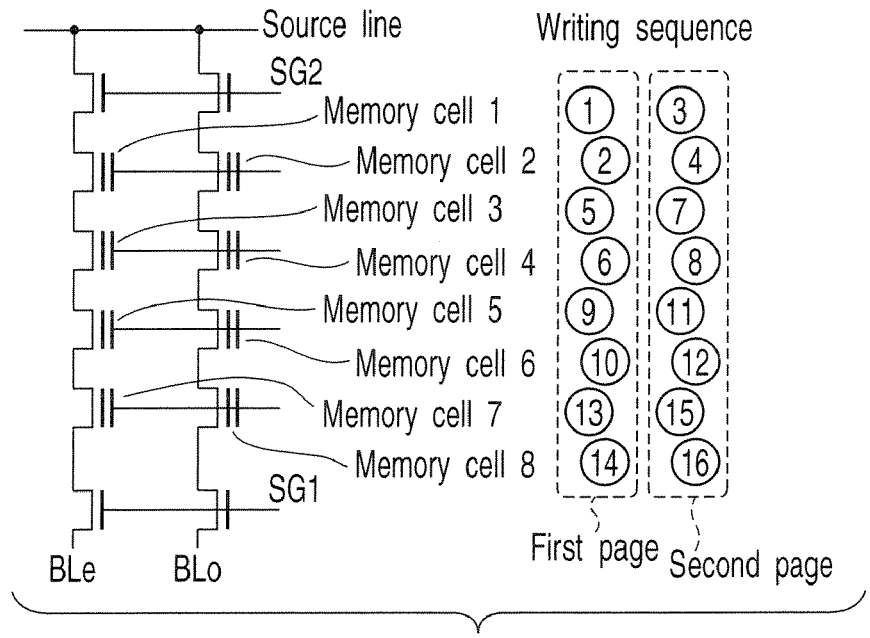
FIG. 8 schematically shows the order in which data is written in the first embodiment.

FIG. 8 schematically shows the order in which writing is done in the first embodiment. To simplify the explanation, FIG. 8 shows a case where a NAND cell is composed of four memory cells. As shown in FIG. 8, a write operation is carried out page by page in a block, beginning with the memory cell close to the source line as follows:

(1) The first page of memory cell 1 is written to.

(2) The first page of memory cell 2 adjacent to memory cell 1 in the word line direction is written to.

(3) The second page of memory cell 1 is written to.

(4) The second page of memory cell 2 is written to.

(5) The first page of memory cell 3 adjacent to memory cell 1 in the bit line direction is written to.

(6) The first page of memory cell 4 adjacent to memory cell 3 in the word line direction is written to.

(7) The second page of memory cell 3 is written to.

(8) The second page of memory cell 4 is written to.

Similarly, writing is continued sequentially.

Figure 9:
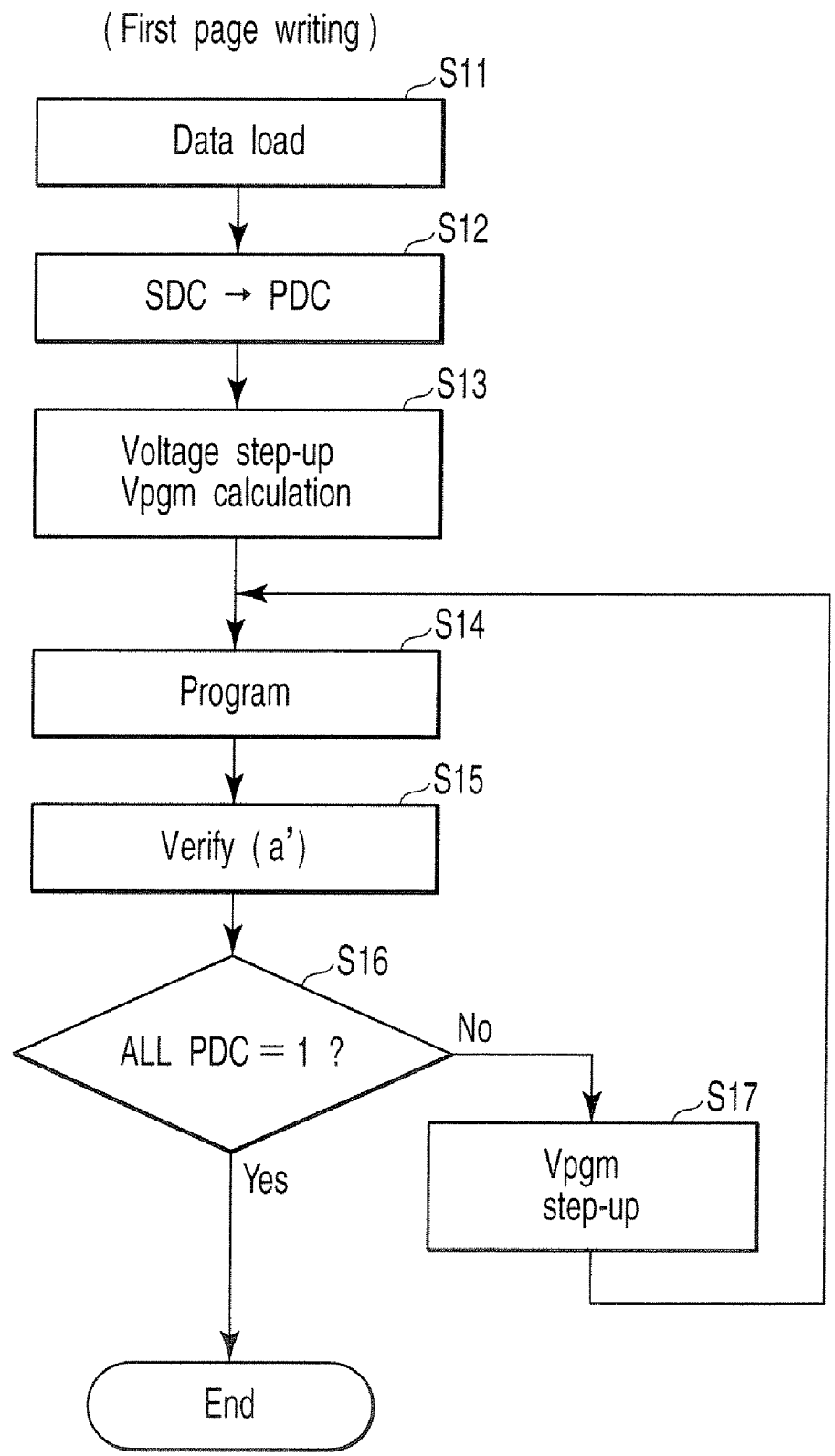
FIG. 9 is a flowchart showing a program sequence for a first page.
Figure 10:
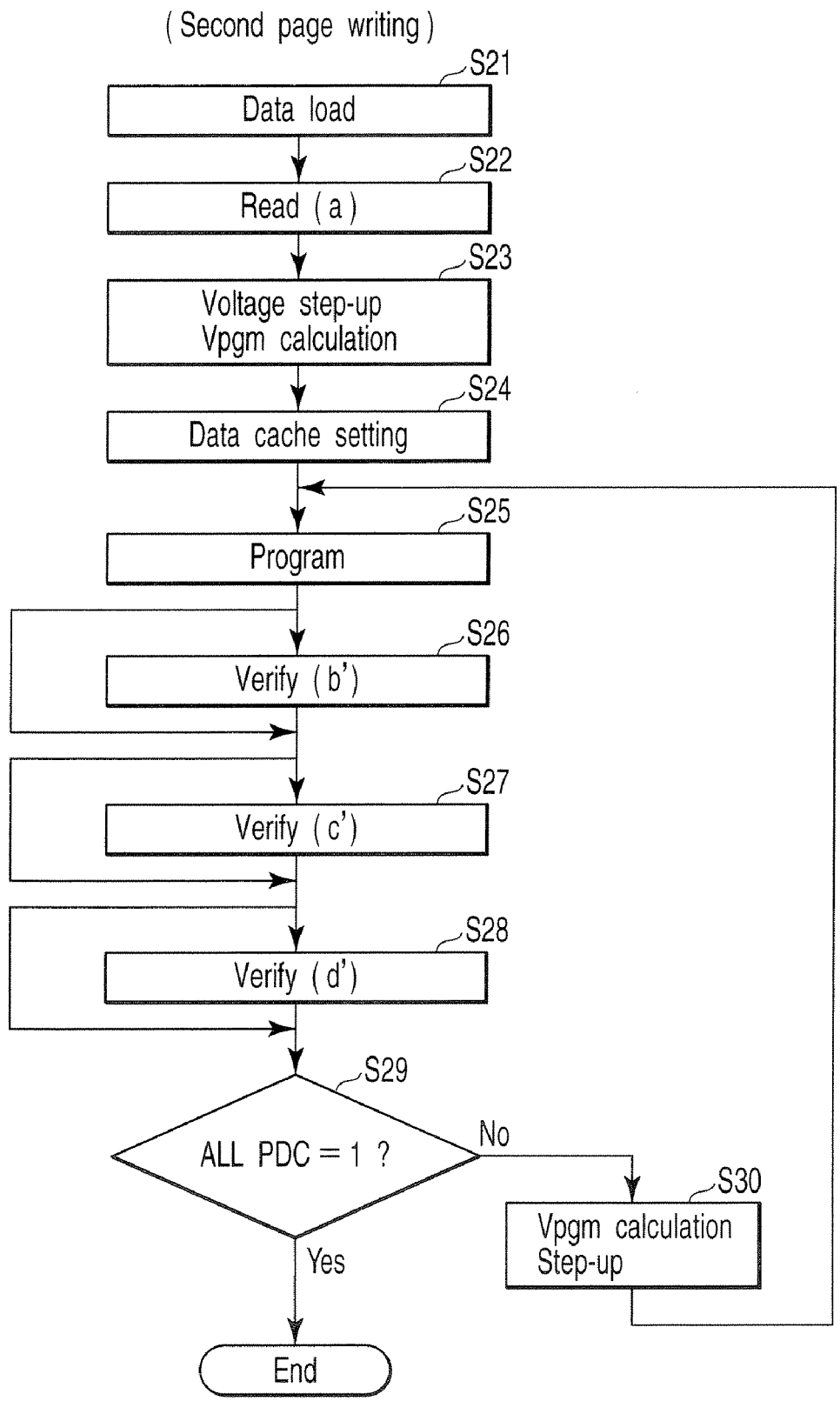
FIG. 10 is a flowchart showing a program sequence for a second page.

FIG. 9 is a flowchart for a first-page program sequence and FIG. 10 is a flowchart for a second-page program sequence.

In a program (write) operation, an address is specified and the second page shown in FIG. 2 is selected.

In the memory, of the two pages, a program operation is carried out only in this order: the first page and the second page. Therefore, first, the first page is selected using an address.

In the first page program of FIG. 9, first, data to be written is externally input and is stored in the SDCs of all the data storage circuits (S11). When a write command has been input, the data in the SDCs of all the data storage circuits are transferred to the PDCs (S12). If data "1" (meaning that no writing is done) has been externally input, node N1a of the PDC of the data storage circuit shown in FIG. 4 goes high. If data "0" (meaning that writing is done) has been externally input, node N1a of the PDC goes low. Hereinafter, suppose the data in the PDC is the potential at node N1a and the data in the SDC is the potential at node N2a.

After this, while the pump circuit described later of the control signal and control voltage generating circuit 7 is raising the write voltage Vpgm to a specific voltage, the arithmetic circuit 7-1 calculates an initial Vpgm (S13). This calculation will be described later.

(Program Operation) (S14)

If signal BLC1 and signal BLCLAMP of FIG. 4 are at Vdd+Vth (the threshold voltage of an n-channel transistor), the transistors 61h, 61t are turned on. As a result, if data "1" (meaning that no writing is done) has been stored in the PDC, the bit line goes to Vdd. If data "0" (meaning that writing is done) has been stored in the PDC, the bit line goes to Vss. The cells which are connected to the selected word line and are on the unselected pages (or whose bit lines are unselected) must not be written to. Therefore, the voltage Vdd is also supplied to the bit lines connected to these cells.

Next, the select gates of the unselected blocks are turned off, with the result that the word lines of the unselected blocks go into the floating state and the select gates go to Vss.

When the transfer gate of the row decoder (not shown) in the selected block is turned on, this causes Vdd (or a potential a little lower than Vdd) to be applied to the select line SGD in the selected block, Vss to be applied to the select line SGS in the selected block, Vpgm (20V) to be applied to the selected word line, and Vpass (10V) to be applied to the unselected word lines. If the bit line is at Vss, the channel of the cell is at Vss and the word line is at Vpgm, which causes writing to be done. If the bit line is at Vdd, the channel of the cell is not at Vss and Vpgm is raised, causing the channel to be boosted by coupling. As a result, the potential difference between the floating gate and the channel does not become larger, which prevents writing from being done.

Figure 11:
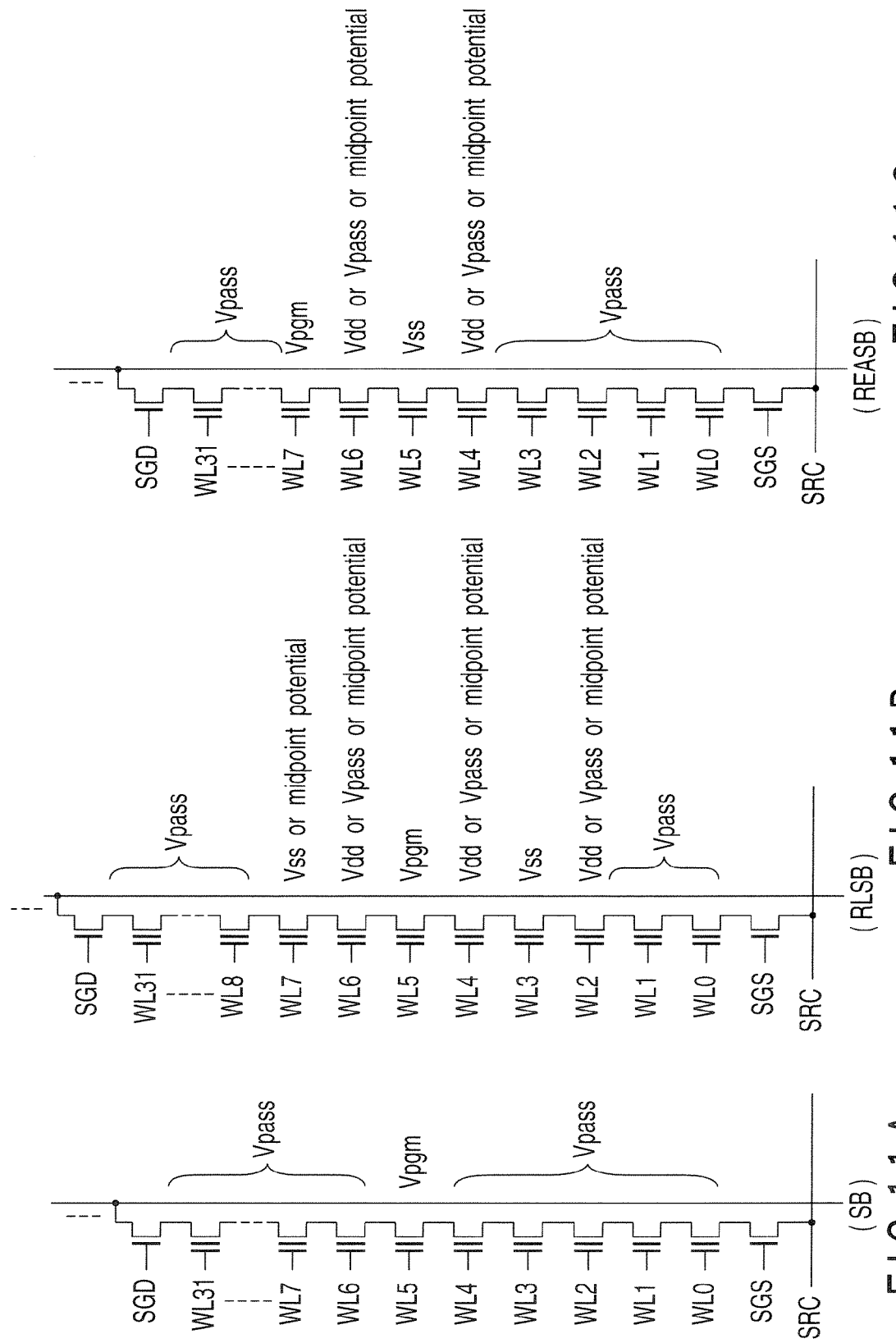
FIGS. 11A, 11B, and 11C show different writing methods.

When writing is done in the order shown in FIG. 8, as the cell to be written to is farther away from the source line, the number of cells written into increases. This causes a problem: the channel becomes more difficult to boost, which may result in erroneous writing. To solve this problem, in place of the self boost (SB) writing method of FIG. 11A, a revised local self boost (RLSB) writing method of FIG. 11B or a revised erased area self boost (REASB) writing method of FIG. 11C is used. In the RLSB writing method, a word line adjacent to the selected word line or a word line two lines away from the selected word line is set at Vss, the selected word line is set at Vpgm, and the other word lines are set at Vpass or a midpoint potential. In the REASB writing method, a word line adjacent to the selected word line on the source side or a word line two lines away from the selected word line is set at Vss, the selected word line is set at Vpgm, and the other word lines are set at Vpass or a midpoint potential. As described above, a word line adjacent to the selected word line or a word line two lines away from the selected word line is set at the ground potential Vss, thereby turning off the memory cell, which makes it easier for the potential of the channel just under the selected cell to be raised.

As a result of the first page writing, the data in the memory cell becomes data "0" or data "2". After the second page writing, the data in the memory cell becomes any one of data "0", "1", "2", and "3".

(Program Verify Read) (S15)

Program verify read is the same as a read operation, except that data is read using potentials "a'", "b'", "c'", "d'" a little higher than the original read potential. In the first-page verify read, a verify read operation is carried out using potential "a'". When the data in the memory cell has reached the verify read potential "a'", the PDC has data "1", which prevents writing from being done.

On the other hand, the threshold voltage of the memory cell has not reached the verify read potential "a'", the PDC has data "0", which allows writing to be done in the next program.

(Vpgm Step-Up) (S16, S17)

A program operation and a verify operation are repeated until the PDCs in all the data storage circuits have gone high (S16). At this time, the program voltage Vpgm is increased gradually, thereby carrying out a write operation (S17).

Next, in the second-page write operation of FIG. 10, first, write data is externally input and is stored in the SDCs of all the data storage circuits 10 (S21). Thereafter, in the first-page write operation, to check the written data, read level "a" (for example, a negative voltage) is set on the word line, thereby reading the data in the memory cell (S22). This read operation is as described above. If the threshold voltage of the cell is lower than the potential on the word line "a", the PDC goes low. If the threshold voltage is higher than the potential, the PDC goes high.

Thereafter, while the pump circuit 72c is raising the write voltage Vpgm to a specific voltage, the arithmetic circuit 7-1 calculates a write voltage Vpgm (S23).

Then, the data cache is set (S24). Specifically, the second page is written to as shown in FIG. 7B.

When the first page writing is about data "1" and the second page writing is about data "1", the second page is not written into.

When the first page writing is about data "1" and the second page writing is about data "0", the data in the memory cell is set to "1" in the second-page writing.

When the first page writing is about data "0" and the second page writing is about data "0", the data in the memory cell is set to "2" in the second-page writing.

When the first page writing is about data "0" and the second page writing is about data "1", the data in the memory cell is set to "3" in the second-page writing.

To perform this operation, the data cache is set.

Specifically, if the data in the memory cell is made "0" (data "1" on the first page and data "1" on the second page), the PDC is set to the high level, the DDC is set to the low level, and the SDC is set to the high level.

If the data in the memory cell is made "1" (data "1" on the first page and data "0" on the second page), the PDC is set to the low level, the DDC is set to the high level, and the SDC is set to the high level.

If the data in the memory cell is made "2" (data "0" on the first page and data "0" on the second page), the PDC is set to the low level, the DDC is set to the high level, and the SDC is set to the low level.

If the data in the memory cell is made "3" (data "0" on the first page and data "1" on the second page), the PDC is set to the low level, the DDC is set to the low level, and the SDC is set to the low level.

The data in each of the PDC, DDC, and SDC is set by supplying the signals BLC1, BLC2, DTG, REG, VREG in a specific sequence and thereby transferring the data in the PDC, DDC, SDC, and TDC. A concrete operation will be omitted.

(Program Operation) (S25)

A program operation is identical with the first-page program operation. If data "1" has been stored in the PDC, writing is not done. If data "0" has been stored in the PDC, writing is done.

(Verify Operation) (S26, S27, S28)

A program verify read operation is the same as a read operation, except that the verify levels "b'", "c'", "d'" are set to levels a little higher than the read level by adding a margin to the read level. Using the verify levels "b'", "c'", "d'", a verify read operation is carried out.

A verify operation is executed in this order: for example, verify levels "b'", "c'", "d'".

Specifically, first, verify level "b'" is set on the word line, thereby verifying whether the threshold voltage of the memory cell has reached verify level "b'" (S26). As a result, if the threshold voltage of the memory cell has reached the verify level, the PDC goes high, which prevents writing from being done. In contrast, if the threshold voltage of the memory cell has not reached the verify read level, the PDC goes low, which allows writing to done in the next program.

Thereafter, verify level "c'" is set on the word line, thereby verifying whether the threshold voltage of the memory cell has reached verify level "c'" (S27). As a result, if the threshold voltage of the memory cell has reached the verify level, the PDC goes high, which prevents writing from being done. In contrast, if the threshold voltage of the memory cell has not reached the verify read level, the PDC goes low, which allows writing to be done in the next program.

Then, verify level "d'" is set on the word line, thereby verifying whether the threshold voltage of the memory cell has reached verify level "d'" (28). As a result, if the threshold voltage of the memory cell has reached the verify level, the PDC goes high, which prevents writing from being done. In contrast, if the threshold voltage of the memory cell has not reached the verify read level, the PDC goes low, which allows writing to be done in the next program.

In this way, the program operation and verify operation are repeated in such a manner that Vpgm is increased by the step voltage DVpgm until the PDCs of all the data storage circuits 10 have gone to the high level (S29, S30).

The step voltage DVpgm is as follows.

(DVpgm Voltage)

As shown in FIG. 8, the cells on an odd-numbered bit line BLo are written behind the cells on an even-numbered bit line BLe. Therefore, the threshold value distribution width shown in each of FIGS. 7A and 7B becomes narrower if Vpgm is the same. However, since the distribution width may remain unchanged, making DVpgm on the odd-numbered bit line higher than DVpgm on the even-numbered bit line enables higher-speed writing.

Furthermore, as shown in FIGS. 7A and 7B, since the threshold value distribution width after the first page writing may be wider than that after the second page writing, the first page DVpgm may be higher than the second page DVpgm.

Although the initial Vpgm at the beginning of writing is written into potential "a'" on the first page, it is written into potential "b'" first on the second page. Since potential "b'" is lower than potential "a'", the initial Vpgm at the beginning of the second page writing has to be lower than that of the first page.

In SB shown in FIG. 11A, the cells on both adjacent sides of the cell to be written to have the potential of their word lines (WL4, WL6) set at Vpass. In contrast, in the case of REASB shown in FIG. 11C, only the cell on one side of the cell to be written to has the potential of its word line (WL8, not shown) set at Vpass. Consequently, the voltage of the floating gate drops relatively. Therefore, when SB is switched to REASB, a voltage drop (of about 1V) in the floating gate is added to Vpgm.

Furthermore, in recent years, the writing characteristic of the cells adjacent to the SGD and SGS (or the cells connected to word lines WL0, WL31) or the cells second adjacent to the SGD and SGS (or the cells connected to word lines WL1, WL30) has been different from that of other cells for reasons of processing. Thus, when data is written to these cells, the initial Vpgm at the beginning of writing is increased or decreased. Accordingly, the relationship between the step voltages DVpgme, DVpgmo corresponding to an even-numbered bit line and an odd-numbered bit line on the first page and second page and the initial Vpgm, the difference voltage (SB-REASB) between SB and REASB, and the correction voltages of WL0, WL1, WL30, and WL31 are as shown in, for example, Table 1:

TABLE 1

|  | DVpgme | DVpgmo | Initial Vpgm |
|---|---|---|---|
| First page | 0.9 V | 1.2 V | 17 V |
| Second page | 0.4 V | 0.5 V | 16 V |
| SB-EASB difference voltage |  | 1 V |  |
| WL0 correction voltage |  | 0.8 V |  |
| WL1 correction voltage |  | 0.4 V |  |
| WL30 correction voltage |  | −0.5 V |  |
| WL31 correction voltage |  | −0.3 V |  |

If the minimum step-up sizes of the limiter circuit are 0.3V, 0.25V, and 0.2V, the step-up sizes are:

|  | DVpgme | DVpgmo |
|---|---|---|
| First page | 0.3 V × 3 | 0.2 V × 4 |
| Second page | 0.2 V × 2 | 0.25 V × 2 |

Accordingly, the initial Vpgm=17V and 16V on an even-numbered bit line and an odd-numbered bit line on the first page and an even-numbered bit line and an odd-numbered bit line on the second page are as follows from FIGS. 13, 14, and 15:

First page: Vpgme=17.1V (in 18$^{th}$ level of FIG. 15)
First page: Vpgmo=17.0V (in 26$^{th}$ level of FIG. 13)
Second page: Vpgme=16.0V (in 21$^{st}$ level of FIG. 13)
Second page: Vpgmo=16.0V (in 17$^{th}$ level of FIG. 14)

Each of the SB-EASB difference voltage, the correction values of word lines WL0, WL1, WL30, WL31 has to be an integral multiple of the minimum step-up size. Accordingly, the relationship between these correction values is as follows:

| | (SB-EASB difference voltage) | |
|---|---|---|
| | Odd number | Even number |
| First page WL0 | 0.9 V (+3 levels) | 1.0 V (+5 levels) |
| Second page | 1.0 V (+5 levels) | 1.0 V (+4 levels) |
| First page WL1 | 0.9 V (+3 levels) | 0.8 V (+4 levels) |
| Second page | 0.8 V (+4 levels) | 0.75 V (+3 levels) |
| First page WL30 | 0.3 V (+1 level) | 0.4 V (+2 levels) |
| Second page | 0.4 V (+2 levels) | 0.5 V (+2 levels) |
| First page WL31 | −0.6 V (−2 levels) | −0.4 V (−2 levels) |
| Second page | −0.4 V (−2 levels) | −0.5 V (−2 levels) |
| First page | −0.3 V (−1 level) | −0.4 V (−2 levels) |
| Second page | −0.4 V (−2 levels) | −0.25 V (−1 level) |

These voltages have to be stored in the ROM section 1-1 of the memory cell array 1 in the form of 6-bit to 8-bit data. The number of items of data on the initial values to be stored increases as much as the number of write operations, when the memory cell is written into by a plurality of write operations to suppress a change in the previously written threshold voltage through coupling between FG-FG (floating gates) caused by a fluctuation in the threshold voltage of the adjacent cell written into later and to obtain a narrow threshold distribution.

For example, in the case of a memory that stores two bits, since the number of pages is two, writing can be done by two write operations. In the case of a memory that store four bits, since the number of pages is four, writing can be done by two write operations, three write operations, and four write operations.

To obtain these items of data, trimming work must be done in a die sort test before shipment. However, the work is cumbersome. Specifically, for example, in a die sort test, the initial Vpgm is set to a low voltage value first and a check is made to see if writing is completed in a determined write loop. If writing is not completed, the initial Vpgm is raised gradually and the Vpgm at the time when writing was completed using the determined write loop is used as the initial Vpgm. If the initial Vpgm is as described above, such a trimming work has to be done for each initial Vpgm, with the result that trimming requires a long time.

In the above example, the initial Vpgm on each of an even-numbered bit line on the first page, an odd-numbered bit line on the first page, an even-numbered bit line on the second page, and an odd-numbered bit line on the second page, that is, four initial Vpgm, has to be trimmed.

In the embodiment, any one of the Vpgm on the odd-numbered, even-numbered, first page, and second page bit lines shown in Table 1 is trimmed as the representative of the rest, and a value of the trimmed one Vpgm is stored in the ROM section 1-1. In this case, for example, an odd-numbered Vpgm=16V on the second page is used as a representative value. The representative value is trimmed and stored in the ROM section 1-1. In this case, since the step-up size of an odd-numbered one on the second page is 0.5V, the minimum step size is 0.25 (the step size 0.5V=0.25V×2). Accordingly, in Table for 25 mV shown in FIG. 14, 16V corresponds to the data at level 17.

Furthermore, only one item of the following data is stored as data in steps of 50 mV in the ROM section 1-1:

SB-EASB difference voltage=1V (in this case, corresponding to the difference between Vpgm=16V and Vpgm=17V)
Correction value of WL0=0.8V
Correction value of WL1=0.4V
Correction value of WL30=−0.5V
Correction value of WL31=−0.3V The correction values of the SB-EASB difference voltages WL0, WL1, WL30, WL31 are calculated in advance from, for example, the trimmed Vpgm. That is, Data on Vpgm is converted into data in steps of 50 mV. On these items of data, the SB-EASB difference voltage and the correction values of WL0, WL1, WL30, WL31 are calculated.

Using the initial Vpgm and correction values stored in the ROM1-1, Vpgm on the word line to be written into is calculated.

Figure 12:
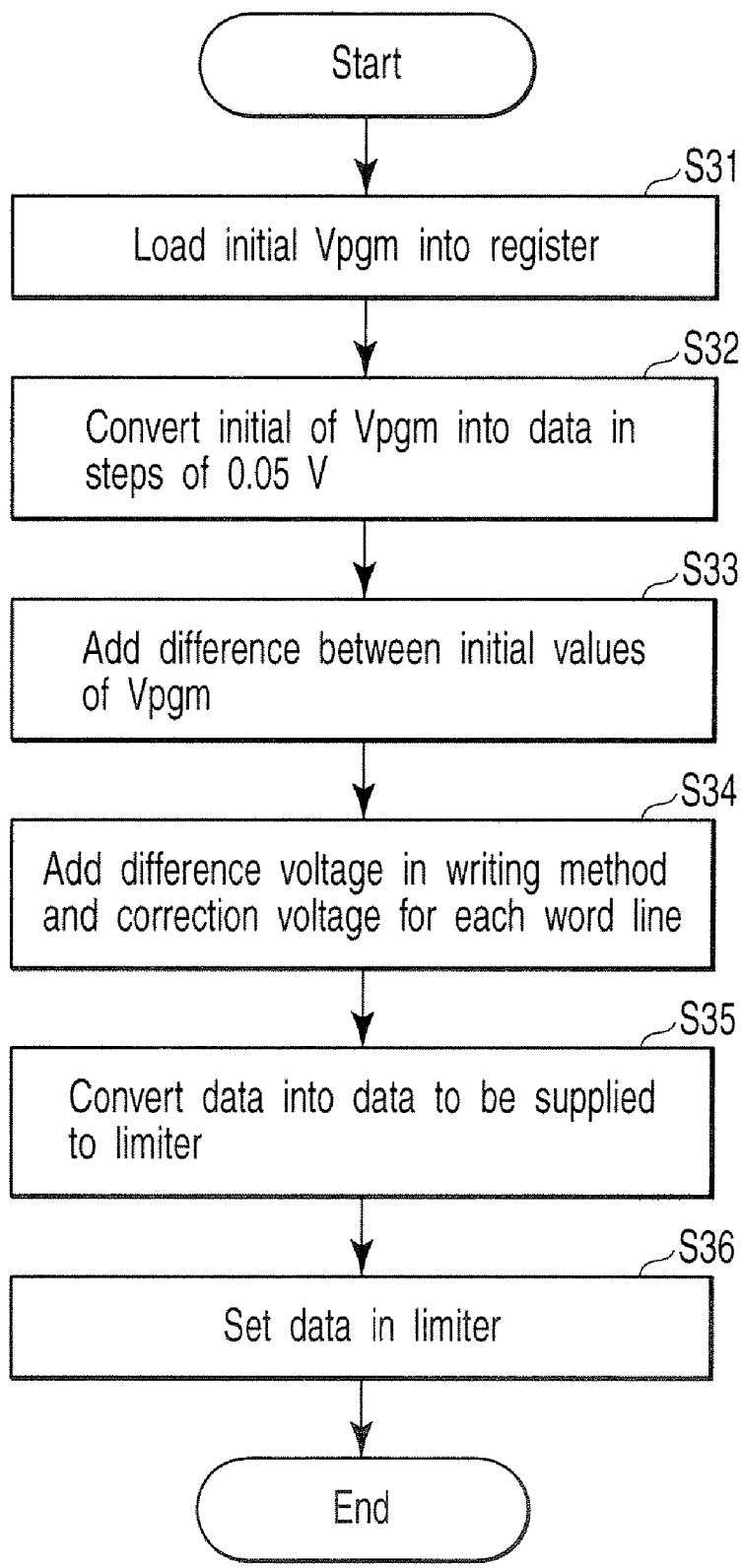
FIG. 12 is a flowchart showing a method of calculating Vpgm of a word line to be written into.

FIG. 12 is a flowchart to help explain a method of calculating Vpgm on the word line to be written into. FIG. 12 shows a case where Vpgm on an odd-bit line of the first page is produced from an odd-numbered initial Vpgm on the second page.

As described above, the minimum step voltages DVpgm of the write voltage are 0.4, 0.5, 0.9, and 1.2V. The greatest common measure of these DVpgm is 0.05V (=50 mV). Thus, data on the initial Vpgm (=16V) of an even-bit line of the second page stored in the ROM section 1-1 is converted into data in steps of 50 mV. On the basis of these items of the converted data, Vpgm on the word line to be written into is calculated.

First, data on the initial Vpgm (=16V) of an even-bit line of the second page stored in the ROM section 1-1 is loaded into, for example, the latch circuit 71a shown in FIG. 5.

Next, the initial Vpgm is converted into data in steps of 50 mV. That is, the data in the latch circuit 71a is quintupled (S32).

In the binary system, when data is multiplied by $2^n$, the data is shifted n bits toward the MSB, whereas data is divided by $2^n$, the data is shifted n bits toward the LSB. A quintuple calculation is expressed by, for example, $2^2+2^0$. Therefore, first, the data in the latch circuit 71a is shifted 2 bits toward the MSB by the selector circuit 71d, which outputs the resulting data. This data is passed through the adding circuit 71f and is held in the register 71g. Next, the data held in the register 71g with no shift by the selector 71e is supplied to the adding circuit 71f. At the same time, the data in the latch circuit 71a with no shift by the selector 71d is supplied to the adding circuit 71f. The data added at the adding circuit 71f is held in the register 71g. At this time, since the selector 71n has selected the output data of the adding circuit 71f, the same data as that in the register 71g is also held in the register 71i.

FIG. 16 shows an example of converting Vpgm into data in steps of 50 mV. Data on the initial Vpgm=16V loaded from the ROM section 1-1 into the latch circuit 71a is "010000" in steps of 0.25V shown in FIG. 14. These are converted, with the result that data on 16.0V is "001010000" in the table in steps of 25 mV shown in FIG. 14.

Thereafter, the difference voltage (=1V) between the initial value Vpgm (=17V) of an odd-bit line of the first page and the initial Vpgm (e.g., 16V) of an even-bit line of the second page is added to the initial Vpgm of an even-bit line of the second page (S33). That is, the SB-EASB difference voltage (=1V) stored in the ROM section 1-1 is read and held in the latch circuit 71b. The data in the latch circuit 71b is selected by the selector 71d and is supplied to the adding circuit 71f. At the same time, the data held in the register 71g is supplied via the selector 71e to the adding circuit 71f. The adding circuit 71f adds these items of data. The result of the addition is stored in the registers 71g, 71i. As a result, the data in the registers correspond to 17.0V, "001100100" in the table in steps of 50 mV shown in FIG. 16.

Next, when the selected word line is, for example, WL30 and the REASB writing method is used, the SB-EASB difference voltage (=1V) held in the latch circuit 71b and the correction voltage (=−0.3V) of word line WL30 memorized in a fuse are added to the data stored in the register 71g (S34). That is, the correction voltage of word line WL30 is read from the ROM section 1-1 and is held in the latch circuit 71c. The data held in the latch circuits 71b, 71c is selected by the selector circuit 71d in sequence and is supplied together with the data selected by the selector 71e to the adding circuit 71f. The data added at the adding circuit 71f is held in the registers 71g, 71i. As a result, the data in the registers correspond to 17.7V, "001110010" in the table in steps of 50 mV shown in FIG. 16.

Then, since the step voltage DVpgm is 0.9V on an odd-bit line of the first page, data on the Vpgm is converted into data on the voltage in steps of 0.3V according to the specification of the limiter circuit 72d (S35). That is, the data stored in the register 71g is divided by 6. Specifically, using the register 71g, selector circuit 71e, and adding circuit 71f, for example, the following equation is calculated:

$$1/6 = 1/2^3 + 1/2^5 + 1/2^7 + 1/2^9 + 1/2^{11}$$

As a result, the data in the registers correspond to 17.7V, "010011" in the table in steps of 0.3V shown in FIG. 15.

Thereafter, the calculated data is supplied to the transistors N01 to N51, N02 to N52 of the limiter circuit 72d (S36). According to the data, the limiter circuit 72d controls the Vpgm output from the pump circuit 72c.

In the first embodiment, one item of Vpgm data as the initial Vpgm and only a set of the SB-EASB difference voltage in the writing method and data on the correction value on each word line are stored in the ROM 1-1 and, on the basis of the stored data, a write voltage for each page is generated. For this reason, even if the step voltage DVpgm differs from page to page, it is not necessary to store a plurality of initial Vpgm in ROM 1-1. Accordingly, in a test before the shipment of products, only one Vpgm has only to be trimmed, which helps shorten the time required for trimming remarkably.

Furthermore, since neither the difference voltage for the writing method nor data on the correction voltage on each word line is required to be stored for each of the first and second page, and even and odd numbers, this helps reduce the storage capacity of the ROM section 1-1.

While, in the first embodiment, control data for the limiter circuit has been generated at the circuit shown in FIG. 6, it may be generated by, for example, software processing.

Second Embodiment

The difference between potentials "d" and "c" on the word line shown in FIG. 7B must be set larger than the difference between potentials "c" and "d". The reason is that the neutral threshold voltage (the threshold voltage in a state where there is no electron in the floating gate) lies between "b" and "c" and that, since data retention becomes worse as the distance from the neutral threshold voltage increases, a margin is secured. Therefore, as in the first embodiment, when the step voltage DVpgm is constant, there is a problem: as the threshold voltage increases, the writing speed becomes slower.

In a second embodiment of the present invention, as shown in FIG. 17, to overcome this problem, the reference voltage Vref is increased gradually as the value of the write voltage Vpgm increases. By doing this, the step voltage DVpgm can be increased as the write voltage Vpgm increases.

Figure 18:
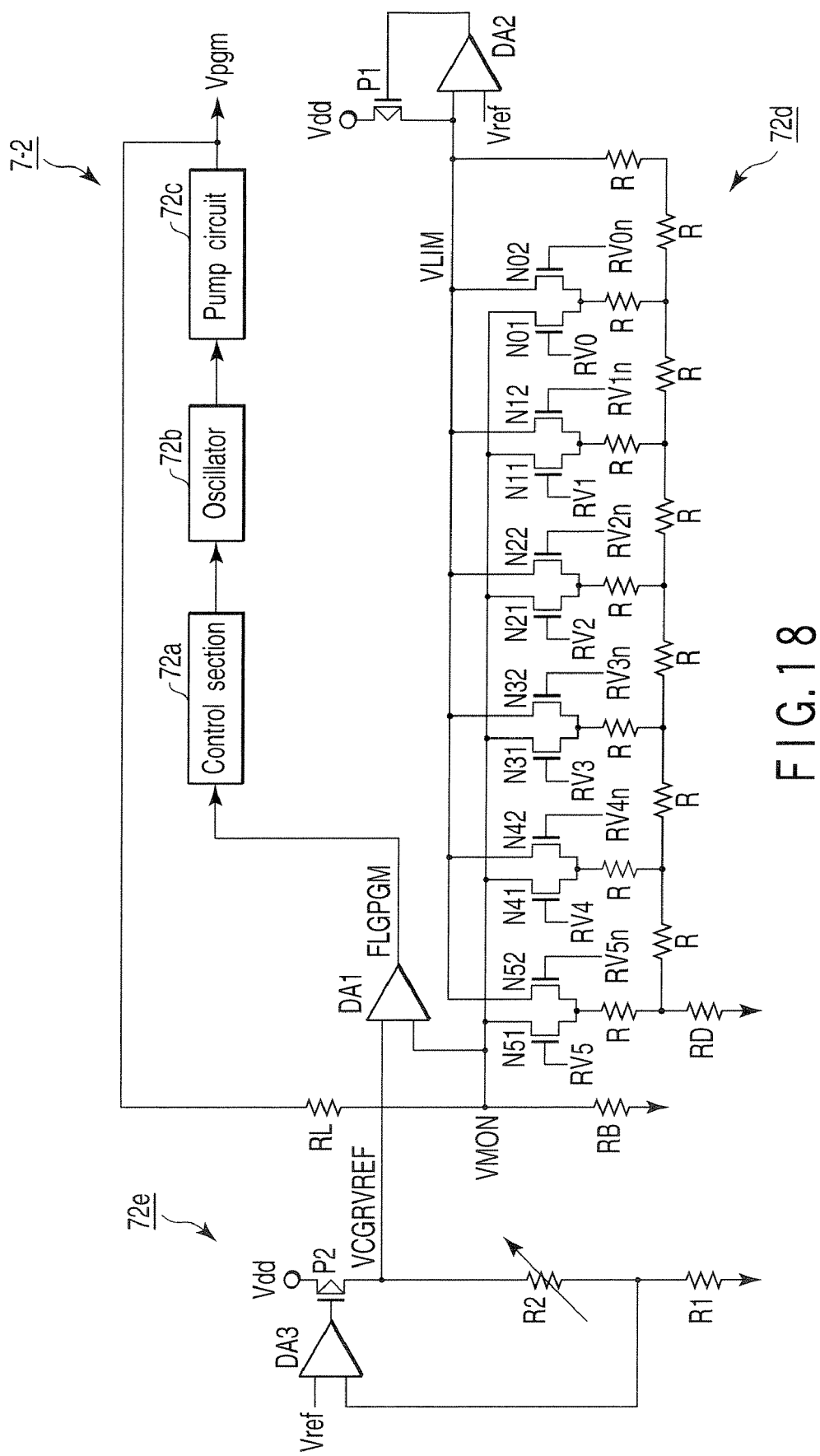
FIG. 18 is a circuit diagram showing an example of a Vpgm generating section in the second embodiment.

FIG. 18 is a circuit diagram of an example of the Vpgm generating section including a reference voltage varying circuit 72e in the second embodiment. In FIG. 18, the same parts as those in FIG. 6 are indicated by the same reference numerals.

FIG. 18 differs from FIG. 6 in that the reference voltage Vref supplied to a differential amplifier DA1 is varied. Specifically, in the reference voltage varying circuit 72e, a reference voltage Vref generated at a bandgap reference circuit (not shown) is input to one input end of a differential amplifier DA3. The output end of the differential amplifier DA3 is connected to the gate of a p-channel transistor P2. One end of the current path of the transistor P2 is connected to a terminal to which a power supply Vdd is supplied. The other end of the current path of the transistor P2 is connected not only to one input end of a differential amplifier DF2 but also to one end of a variable resistance R2. The other end of the variable resistance R2 is connected not only to the other input terminal of the differential amplifier DA3 but also to the ground via the resistance R1.

With the above configuration, the resistance value of the variable resistance R2 is increased as the write voltage Vpgm increases, enabling the reference voltage Vref to increase. Therefore, the step voltage DVpgm can be increased as the reference voltage Vref increases.

As described above, in the second embodiment, the raised write voltage Vpgm makes it possible to make higher the step voltage in writing a high threshold voltage, which enables the writing speed to be made faster.

In the above embodiments, the present invention has been applied to a semiconductor memory device which stores multivalued data. The present invention is not limited to this and may be applied to a semiconductor memory device which stores two-valued data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising: a memory cell array in which a plurality of memory cells connected to word lines and bit lines are arranged in a matrix; a storage section which stores an initial value of a write voltage corresponding to a write operation and a correction value for correcting the write voltage; and a voltage generating circuit which generates a word line write voltage in a first write operation on a first memory cell in the memory cell array or a second write operation on a second memory cell in the memory cell array on the basis of the initial value and correction value of the write voltage stored in the storage section; wherein the voltage generating circuit, in the first write operation, generates a first high voltage supplied to the first memory cell in the memory cell array on the basis of the

17 initial value and correction value of the write voltage and further generates voltages higher than the first high voltage in increments of a first step voltage, and in the second write operation, generates a second high voltage supplied to the second memory cell in the memory cell array on the basis of the initial value and correction value of the write voltage and further generates voltages higher than the second high voltage in increments of a second step voltage, and the first step voltage is higher than the second step voltage.

2. The semiconductor memory device according to claim 1, wherein the first memory cell is adjacent to the second memory cell.

3. The semiconductor memory device according to claim 1, wherein the first memory cell shares a word line with the second memory cell and a bit line of the first memory cell is adjacent to a bit line of the second memory cell.

4. The semiconductor memory device according to claim 1, wherein the first memory cell shares a bit line with the second memory cell, and a word line of the first memory cell is adjacent to a word line of the second memory cell.

5. The semiconductor memory device according to claim 1, wherein the voltage generating circuit includes an arithmetic circuit which comprises
    a plurality of latch circuits which hold data from the storage section,
    a first select circuit which selects one latch circuit from said plurality of latch circuits and which outputs the data held in the selected latch circuit on the basis of a shift control signal,
    a second select circuit which selectively outputs data to be supplied to an input end on the basis of the shift control signal,
    an adding circuit which adds the output data of the first select circuit and the output data of the second select circuit and supplies the resulting data as input data to the input ends of the first and second select circuits,
    a maximum value detecting circuit which detects the maximum value from the output data of the adding circuit and which, if the output data of the adding circuit is smaller than a preset maximum value, outputs the output data of the adding circuit and, if the output data of the adding circuit is larger than the preset maximum value, outputs the preset maximum value, and
    a register which holds the output data of the maximum value detecting circuit and supplies the output data to the first and second select circuits.

6. The semiconductor memory device according to claim 1, wherein the initial value of the write voltage and the correction value are trimmed in a die-sort test.

7. The semiconductor memory device according to claim 1, wherein the voltage generating circuit includes
    a voltage generating section which generates the write voltage according to an input control voltage,
    a voltage divider which divides the write voltage generated at the voltage generating section and outputs the divided voltage,
    a differential amplifier to whose first input end the output voltage of the voltage divider is supplied and to whose second input terminal a reference voltage is supplied and which detects the difference voltage between the divided voltage and the reference voltage and supplies the difference voltage as the control signal to the voltage generating section,
    a first adjusting circuit which adjusts the divided voltage according to the data supplied from the register of the arithmetic circuit, and

18 a second adjusting circuit which adjusts the reference voltage.

8. The semiconductor memory device according to claim 7, wherein the second adjusting circuit increases the reference voltage as the write voltage increases.

9. A semiconductor memory device comprising:
    a memory cell array in which a plurality of memory cells connected to word lines and bit lines are arranged in a matrix;
    a storage section which stores an initial value of a write voltage corresponding to a write operation and a correction value for correcting the write voltage; and
    a voltage generating circuit which generates a word line write voltage in a first write operation on a first memory cell in the memory cell array or a second write operation on a second memory cell in the memory cell array on the basis of the initial value and correction value of the write voltage stored in the storage section,
    wherein the storage section holds a first voltage value as a difference between a first high voltage and a second high voltage,
    the voltage generating circuit converts the voltage value of the first high voltage into a second voltage value of the greatest common measure of a first step voltage and a second step voltage, obtains a third voltage value by adding the first voltage value and the correction value to the second voltage value, and determines the voltage value of the second high voltage from the third voltage value on the basis of the second step voltage.

10. A semiconductor memory device comprising:
    a memory cell array in which a plurality of memory cells connected to word lines and bit lines are arranged in a matrix;
    a storage section which stores an initial value of a write voltage corresponding to the write operation and a correction value for correcting the write voltage, the initial value of the write voltage being trimmed in a die sort test; and
    a voltage generating circuit which generates a word line write voltage on the basis of a reference voltage, the initial value and the correction value of the write voltage stored in the storage section in a write operation, and which includes an adjusting circuit that adjusts the reference voltage and that increases the reference voltage as the write voltage increases.

11. The semiconductor memory device according to claim 10, wherein the voltage generating circuit generates a word line write voltage in a first write operation on a first memory cell in the memory cell array or in a second write operation on a second memory cell in the memory cell array on the basis of the initial value and correction value of the write voltage stored in the storage section.

12. The semiconductor memory device according to claim 11, wherein the first memory cell is adjacent to the second memory cell.

13. The semiconductor memory device according to claim 11, wherein the first memory cell shares a word line with the second memory cell, and a bit line of the first memory cell is adjacent to a bit line of the second memory cell.

14. The semiconductor memory device according to claim 11, wherein the first memory cell shares a bit line with the second memory cell, and a word line of the first memory cell is adjacent to a word line of the second memory cell.

15. A semiconductor memory device comprising:
    a memory cell array in which a plurality of memory cells connected to word lines and bit lines are arranged in a matrix;

a control circuit which controls the potentials of the word lines and bit lines;

a storage section which stores an initial value of a write voltage corresponding to a write operation and a correction value for correcting the write voltage; and a voltage generating circuit which generates a write voltage based on the initial value of the write voltage and the correction value, wherein the control circuit performs a first write operation on the basis of a first write voltage supplied from the voltage generating circuit, performs a second write operation on the basis of a voltage a first step voltage higher than the first write voltage supplied from the voltage generating circuit, performs an n-th write operation on the basis of a voltage an (n–1)-th step voltage higher than the (n–1)-th write voltage supplied from the voltage generating circuit, and performs an (n+1)-th write operation on the basis of a voltage an n-th step voltage higher than the n-th write voltage supplied from the voltage generating circuit, the n-th step voltage satisfying the expression the (n–1)-th step voltage the n-th step voltage.

16. The semiconductor memory device according to claim 15, wherein the voltage generating circuit generates a word line write voltage in a first write operation on a first memory cell in the memory cell array or in a second write operation on a second memory cell in the memory cell array on the basis of the initial value and correction value of the write voltage stored in the storage section.

17. The semiconductor memory device according to claim 16, wherein the first memory cell is adjacent to the second memory cell.

18. The semiconductor memory device according to claim 16, wherein the first memory cell shares a word line with the second memory cell and a bit line of the first memory cell is adjacent to a bit line of the second memory cell.

* * * * *